United States Patent
Keskin et al.

(10) Patent No.: US 12,500,552 B2
(45) Date of Patent: Dec. 16, 2025

(54) RADIO FREQUENCY (RF) FRONT END ENVELOPE TRACKING WITH MACHINE LEARNING

(71) Applicant: QUALCOMM Incorporated, San Diego, CA (US)

(72) Inventors: Mustafa Keskin, San Diego, CA (US); Paul Brian Sheehy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 605 days.

(21) Appl. No.: 17/935,074

(22) Filed: Sep. 23, 2022

(65) Prior Publication Data

US 2024/0106395 A1    Mar. 28, 2024

(51) Int. Cl.
    *H03F 1/02* (2006.01)
    *H03F 3/24* (2006.01)

(52) U.S. Cl.
    CPC ........... *H03F 1/0233* (2013.01); *H03F 3/245* (2013.01); *H03F 2200/105* (2013.01); *H03F 2200/451* (2013.01)

(58) Field of Classification Search
    CPC .. H03F 1/0233; H03F 3/245; H03F 2200/105; H03F 2200/45
    USPC ........................................................ 330/297
    See application file for complete search history.

(56) References Cited

U.S. PATENT DOCUMENTS

| | | | |
|---|---|---|---|
| 8,159,295 B2 * | 4/2012 | Asbeck ................. | H03F 1/3247 330/297 |
| 9,385,665 B2 | 7/2016 | Toivonen et al. | |
| 10,218,326 B2 * | 2/2019 | Chen ..................... | H03G 3/3042 |
| 2003/0146791 A1 * | 8/2003 | Shvarts ................... | H03F 1/025 330/297 |
| 2014/0266448 A1 * | 9/2014 | Cha ......................... | H03F 1/223 330/261 |
| 2015/0146819 A1 | 5/2015 | Chowdhury et al. | |

(Continued)

FOREIGN PATENT DOCUMENTS

EP    2705604 B1    4/2020

OTHER PUBLICATIONS

Switching Regulator (Year: 2025).*

(Continued)

*Primary Examiner* — Hafizur Rahman
(74) *Attorney, Agent, or Firm* — Polsinelli/Qualcomm Incorporated

(57) ABSTRACT

Aspects described herein include devices and methods for an envelope tracking power supply. In some aspects, the envelope tracking power supply includes an envelope signal input port, an output power port, an input interface circuit coupled to the envelope signal input port, sensing and conditioning circuitry, and amplifier circuitry coupled between the input interface circuit and the sensing and conditioning circuitry, the amplifier circuitry having one or more control inputs. The envelope tracking power supply additionally includes switcher circuitry coupled to the output of the sensing and conditioning circuitry, and the output power port, and the supply further includes output filter circuitry coupled to the output power port and machine learning circuitry configured to receive state tracking data for performance of a transmit power amplifier (PA) that receives power via the output power port.

30 Claims, 18 Drawing Sheets

(56) References Cited

U.S. PATENT DOCUMENTS

| | | | |
|---|---|---|---|
| 2015/0236877 A1* | 8/2015 | Peng | H04B 1/0458 |
| | | | 375/297 |
| 2016/0006397 A1* | 1/2016 | Wimpenny | H03F 3/19 |
| | | | 330/297 |
| 2018/0123538 A1* | 5/2018 | Chen | H03F 3/21 |
| 2020/0091878 A1* | 3/2020 | Maxim | H03F 3/45475 |
| 2021/0194517 A1 | 6/2021 | Mirea et al. | |
| 2023/0291359 A1* | 9/2023 | Ji | H03F 3/45475 |
| 2024/0030879 A1* | 1/2024 | Yamamoto | H03F 1/0216 |

OTHER PUBLICATIONS

International Search Report and Written Opinion—PCT/US2023/074399—ISA/EPO—Jan. 9, 2024.
Krishnamoorthy H.S., et al., "Scalable Power Converter Architectures with Quantized Output and Envelope Prediction for Wireless Communication", 2021 IEEE, Applied Power Electronics Conference and Exposition (APEC), Jun. 14, 2021, pp. 2377-2382, XP033945007, DOI: 10.1109/APEC42165.2021.9487375 [retrieved on Jul. 14, 2021] the whole document Section I and V, figures 1, 2, 4-10.

* cited by examiner

900

```
┌─────────────────────────────────────────────────────────┐
│ Receive an envelope tracking signal at an envelope      │
│ signal input port of the envelope tracking power supply │
│                          902                            │
└─────────────────────────────────────────────────────────┘
                            │
                            ▼
┌─────────────────────────────────────────────────────────┐
│ Operate a linear amplifier using the envelope tracking  │
│ signal with control settings to generate a high         │
│ frequency component of an envelope tracking supply      │
│ voltage                                                 │
│                          904                            │
└─────────────────────────────────────────────────────────┘
                            │
                            ▼
┌─────────────────────────────────────────────────────────┐
│ Operate switcher circuitry using the control settings   │
│ and an output of the linear amplifier to generate a low │
│ frequency component of the envelope tracking supply     │
│ voltage                                                 │
│                          904                            │
└─────────────────────────────────────────────────────────┘
                            │
                            ▼
┌─────────────────────────────────────────────────────────┐
│ Track performance of a power amplifier operating using  │
│ the envelope tracking supply voltage to generate state  │
│ tracking data                                           │
│                          908                            │
└─────────────────────────────────────────────────────────┘
                            │
                            ▼
┌─────────────────────────────────────────────────────────┐
│ Update, using machine learning circuitry with the state │
│ tracking data, control settings for the envelope        │
│ tracking power supply                                   │
│                          910                            │
└─────────────────────────────────────────────────────────┘
```

*FIG. 9*

RADIO FREQUENCY (RF) FRONT END ENVELOPE TRACKING WITH MACHINE LEARNING

FIELD

The present disclosure relates generally to electronics and wireless communications. For example, aspects of the present disclosure relate to power envelope tracking and power management in radio frequency (RF) front end (RFFE) modules used in wireless communications.

BACKGROUND

Wireless communication devices and technologies are becoming ever more prevalent. Wireless communication devices generally transmit and receive communication signals. RFFE modules are wireless communication apparatuses that power wireless transmit signals, and can also manage reception of wireless signals from an antenna. With the increasing prevalence of wireless communication technologies and increasing communication system throughputs and increasing complexity of power management for wireless devices, RFFE modules are becoming a larger component of wireless devices. Limiting power usage and managing power efficiency is an important goal of device design, particularly for mobile devices.

SUMMARY

Various implementations of systems, methods, and devices within the scope of the appended claims each have several aspects, no single one of which is solely responsible for the desirable attributes described herein. Without limiting the scope of the appended claims, some prominent features are described herein. Aspects described herein include devices, wireless communication apparatuses, circuits, and modules supporting envelope tracking in an RFFE with machine learning.

One aspect is an apparatus. The apparatus includes a power management integrated circuit (PMIC) comprising: an envelope signal input port; an output power port; an input interface circuit having an output and an input coupled to the envelope signal input port; sensing and conditioning circuitry having an output and an input; amplifier circuitry coupled between the output of the input interface circuit and the input of the sensing and conditioning circuitry, the amplifier circuitry having one or more control inputs; switcher circuitry having an input and an output, wherein the input is coupled to the output of the sensing and conditioning circuitry, and wherein the output is coupled to the output power port; and output filter circuitry, wherein the output filter circuitry is coupled to the output power port via the output filter circuitry; a radio frequency front end (RFFE) unit comprising a transmit power amplifier (PA) that receives power via the output power port; and machine learning circuitry having an output coupled to the one or more control inputs, and one or more inputs configured to receive state tracking data for performance of the transmit PA of the RFFE unit.

Some such aspects further comprise a modem, wherein the modem comprises the machine learning circuitry; and wherein the machine learning circuitry is configured to output control signals to reduce power usage by adjusting amplifier settings of the amplifier circuitry or switching regulator settings for the switcher circuitry.

One aspect is a method of operating an envelope tracking power supply. The method comprises receiving an envelope tracking signal at an envelope signal input port of the envelope tracking power supply; operating a linear amplifier using the envelope tracking signal with control settings to generate a high frequency component of an envelope tracking supply voltage; operating switcher circuitry using the control settings and an output of the linear amplifier to generate a low frequency component of the envelope tracking supply voltage; tracking performance of a power amplifier operating using the envelope tracking supply voltage to generate state tracking data; using a machine learning circuitry with the state tracking data to update control settings for the envelope tracking power supply.

In some aspects, such a method can operate where the power amplifier comprises a replica power amplifier used in a feedback system of the envelope tracking power supply, wherein the envelope tracking signal is generated from a wireless communication signal, and wherein the control settings are further used to control a transmit power amplifier used to transmit the wireless communication signal via an antenna of a wireless communication apparatus.

In some aspects, such a method can operate where envelope tracking power supply further comprises digital to analog converter (DAC) circuitry coupled to an input interface circuit and the replica power amplifier.

Another aspect is a method of calibrating an envelope tracking power supply. The method includes performing a first power consumption measurement in an envelope tracking power supply at a first performance setting with a linear amplifier disabled and a switcher circuit enabled, wherein the envelope tracking power supply comprises the linear amplifier configured to provide a high frequency component of an envelope tracking supply voltage, and wherein the envelope tracking power supply further comprises the switcher circuit configured to provide a low frequency component of the envelope tracking supply voltage; performing a second power consumption measurement at the first performance setting with the linear amplifier enabled and the switcher circuit disabled; performing a third power consumption measurement at the first performance setting with the linear amplifier enabled and the switcher circuit enabled; and performing an operating analysis using the first power consumption measurement, the second power consumption measurement, and the third power consumption measurement; and updating control settings based on the operating analysis.

Another aspect is an apparatus. The apparatus includes an envelope tracking power supply comprising: an envelope signal input port; an output power port; an input interface circuit having an output and an input coupled to the envelope signal input port; sensing and conditioning circuitry having an output and an input; amplifier circuitry coupled between the output of the input interface circuit and the input of the sensing and conditioning circuitry, the amplifier circuitry having one or more control inputs; switcher circuitry having an input and an output, wherein the input is coupled to the output of the sensing and conditioning circuitry, and wherein the output is coupled to the output power port; output filter circuitry, wherein the output filter circuitry is coupled to the output power port via the output filter circuitry; and machine learning circuitry having an output coupled to the one or more control inputs, and one or more inputs configured to receive state tracking data for performance of a radio frequency front end (RFFE) transmit power amplifier (PA) that receives power via the output power port.

Some such aspects operate where the envelope tracking power supply further comprises a replica power amplifier having a signal input, a supply input coupled to the output power port, and a signal output, wherein the signal output is coupled to the machine learning circuitry to provide a radio frequency signal as part of the state tracking data, wherein the signal input is configured to receive a wireless communication signal, and wherein the envelope signal input port is configured to receive an envelope tracking signal generated from the wireless communication signal.

Some such aspects operate where the state tracking data further comprises a high frequency voltage value output from the amplifier circuitry, a low frequency voltage value output from the switcher circuitry, and a sensing value input to the sensing and conditioning circuitry from the amplifier circuitry.

Some such aspects can further include digital to analog converter (DAC) circuitry coupled to the input interface circuit and the replica power amplifier, wherein the DAC circuitry is configured to provide a test signal to the replica power amplifier to generate the state tracking data as calibration data during a calibration mode used with the replica power amplifier enabled and the RFFE transmit power amplifier disabled to create initial control settings for operation of the RFFE transmit power amplifier.

Some such aspects operate where the DAC circuitry comprises a transmit DAC and an envelope tracking DAC, or where the sensing value is generated by a sensing element coupled between the output of the amplifier circuitry and the input of the sensing and conditioning circuitry. Some such aspects operate where the output power port is coupled to a voltage supply of a transmission power amplifier, and wherein the transmission power amplifier is configured to amplify a wireless communication signal.

Some such aspects can further include an envelope tracking signal input to the envelope signal input port is received from modem circuitry used to generate a tracking voltage at the output power port, and can operate where coupler circuitry is coupled to an output of the transmission power amplifier to provide feedback as part of the state tracking data.

Some such aspects can further operate where the amplifier circuitry comprises a linear amplifier configured to provide a first portion of a high frequency component of a tracking voltage; and wherein the amplifier circuitry further comprises a switching amplifier configured to operate in a saturation mode and provide a second portion of the high frequency component of the tracking voltage when the tracking voltage is above a threshold value.

Some such aspects can further operate where the threshold value is based on a peak-to-average power ratio (PAPR) of a wireless communication signal, a traffic value associated with the wireless communication signal, a bandwidth associated with the wireless communication signal, or an operating mode.

Some such aspects can further operate where the one or more control inputs further comprises: a first tracking value generated by a first sensing element coupled between an output of the linear amplifier and the input of the sensing and conditioning circuitry; and a second tracking value generated by a second sensing element coupled between an output of the switching amplifier and the input of the sensing and conditioning circuitry.

Some such aspects can further operate where the envelope tracking signal and the wireless transmission signal are both generated by modem circuitry using a same set of communication data or where the state tracking data comprises dynamic time slice data of for a wireless communication signal. Some such aspects can further operate where the dynamic time slice data comprises dynamically clustered data based on one or more of a bandwidth for the wireless communication signal, a device operating mode, high peak signal events, high slope signal events, high power events. Some such aspects can further operate where the machine learning circuitry is configured to condition circuitry in a transmit signal path using prediction outputs generated from the dynamically clustered data. Some such aspects can further operate where the machine learning circuitry is configured to identify operational settings for a transmit signal path associated with efficient battery usage and the dynamically clustered data, and to output control signals to adjust amplifier settings to reduce power usage during transmission of portions of the wireless communication signal used to generate the dynamically clustered data.

In some aspects, the apparatuses described above can function in a system that includes a mobile device with a camera for capturing one or more pictures. In some aspects, the apparatuses described above can include a display screen for displaying one or more images or interface displays. In some aspects, additional wireless communication circuitry is provided. The summary is not intended to identify key or essential features of the claimed subject matter, nor is it intended to be used in isolation to determine the scope of the claimed subject matter. The subject matter should be understood by reference to appropriate portions of the entire specification, any or all drawings, and each claim.

The foregoing, together with other features and embodiments, will become more apparent upon referring to the following specification, claims, and accompanying drawings.

BRIEF DESCRIPTION OF THE DRAWINGS

In the figures, like reference numerals refer to like parts throughout the various views unless otherwise indicated. For reference numerals with letter character designations such as "102*a*" or "102*b*", the letter character designations may differentiate two like parts or elements present in the same figure. Letter character designations for reference numerals may be omitted when it is intended that a reference numeral encompass all parts having the same reference numeral in all figures.

FIG. 9 is a flow diagram illustrating aspects of a method for using machine learning for envelope tracking in accordance with aspects described herein.

DETAILED DESCRIPTION

Figure 1:
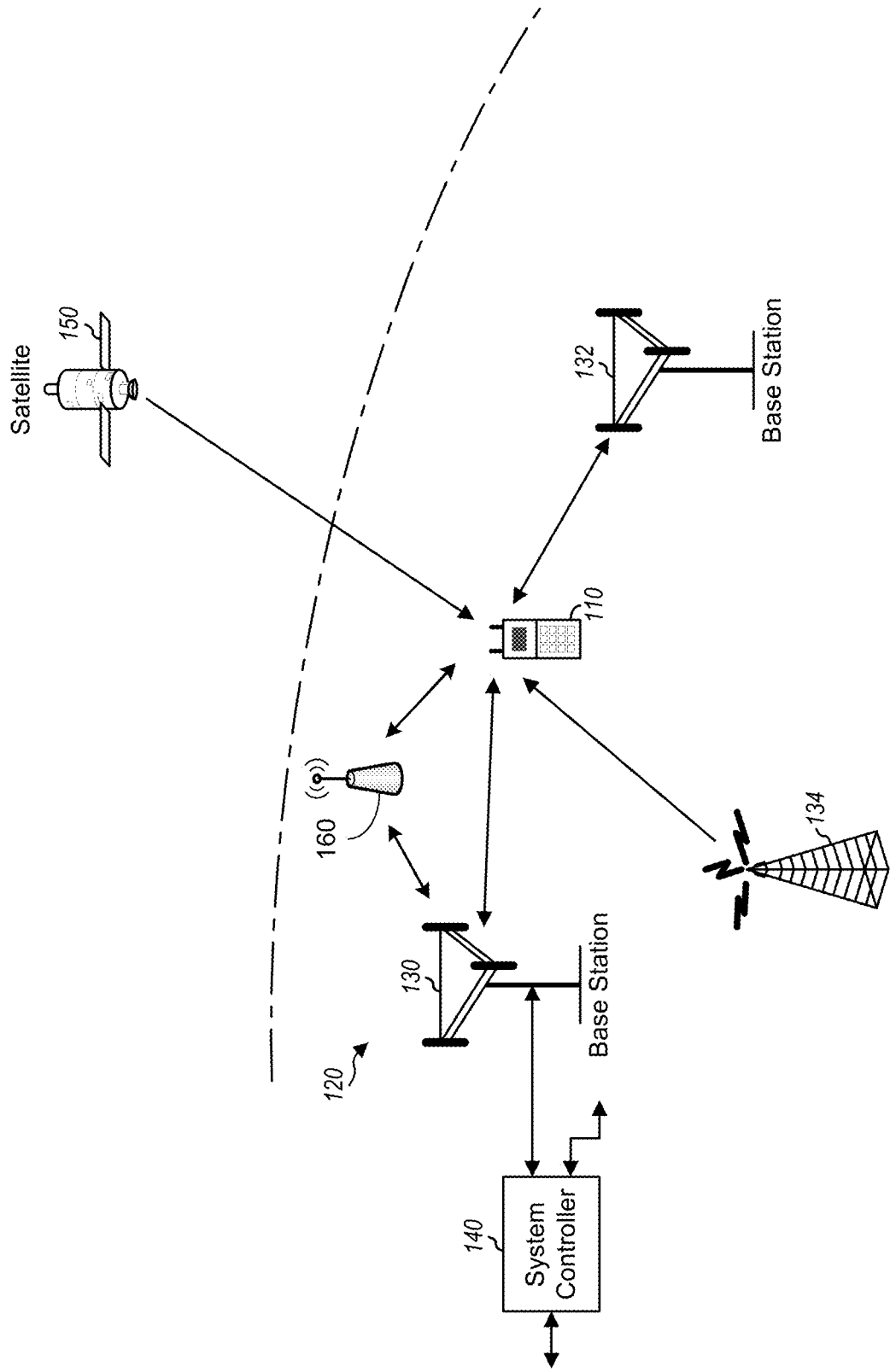
FIG. 1 is a diagram showing a wireless communication system communicating with a wireless device that can be implemented according to aspects described herein.

The detailed description set forth below in connection with the appended drawings is intended as a description of example aspects and implementations and is not intended to represent the only implementations in which the invention may be practiced. The detailed description includes specific details for the purpose of providing a thorough understanding of the example aspects and implementations. In some instances, some devices are shown in block diagram form. Drawing elements that are common among the following figures may be identified using the same reference numerals.

The progression of wireless communication infrastructure, such as for Third Generation Partnership Project (3GPP) fifth generation (5G) millimeter wavelength (mmW) systems, involves increasing importance of the radio frequency (RF) front end (RFFE) module. For example, 5G standards for cellular communications involve increasing complexity of frequency combinations and communication throughput options. Power amplifiers to enable RFFE operation consume significant amounts of power in an environment where, particularly for portable systems, power dissipation and power efficiency are important operating characteristics.

Aspects described herein include improved envelope tracking systems for wireless transmit communications, which are used to match the voltage available to the transmit power amplifier in an RFFE to the needed power identified by the envelope tracking. Aspects described herein improve the operation of RFFE modules by using feedback and monitoring modules within local loops of linear amplifier controls and switching regulator controls. The local feedback loops for linear amplifier and switching regulator controls manage demand from power amplifiers during transmission, and control systems can improve power efficiency of such elements in envelope tracking power supplies for transmission power amplifiers.

Some aspects can include machine learning circuitry to track the controls in the local linear amplifier and switching regulator loops. With increasing efficiency of machine learning circuitry, the use of machine learning to track power supply control inputs and responsive performance can conserve more power than is consumed by the use of the machine learning circuitry to update control input operations.

For example, in power amplifier operation, power efficiency is increased and unnecessary power dissipation is reduced by the use of multiple envelope tracking system amplifiers that support different operating conditions, and limit oversupply of power the transmit power amplifier that corresponds to excess power dissipation. The use of machine learning circuitry to improve tracking can improve power performance while limiting possible errors from over limiting the power supply when conserving power.

Further details regarding aspects described herein are provided with respect to the figures below.

FIG. 1 is a diagram showing a wireless device 110 communicating with a wireless communication system 120. In accordance with aspects described herein, the wireless device can include electronic devices with wireless communication capabilities enabled by RFFE modules along with other wireless communication elements. Devices within the system 120 can use envelope power tracking and power amplifier with feedback systems support to improve power efficiency of devices such as the wireless communication device operating in the communication system 120.

The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. Communication elements of the wireless device 110 for implementing mmW and non-mmW communications in accordance with any such communication standards can be supported by various designs of transceivers using a chained signal routing. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, or other such mobile device (e.g., a device integrated with a display screen). Other examples of the wireless device 110 include a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134) and/or signals from satellites (e.g., a satellite 150 in one or more global navigation satellite systems (GNSS), etc.). Wireless device 110 may support one or more radio technologies for wireless communication such as LTE, WCDMA, CDMA 1x, EVDO, TD-SCDMA, GSM, 802.11, 5G, etc.

The wireless communication system 120 may also include a wireless device 160. In an exemplary embodiment, the wireless device 160 may be a wireless access point, or another wireless communication device that comprises, or comprises part of a wireless local area network (WLAN). In an exemplary embodiment, the wireless device 110 may be configured as a customer premises equipment (CPE), which may be in communication with a base station 130 and another wireless device 110, or other devices in the wireless communication system 120. In some embodiments, the CPE may be configured to communicate with the wireless device 160 using WAN signaling and to interface with the base station 130 based on such communication instead of the wireless device 160 directly communicating with the base station 130. In exemplary embodiments where the wireless device 160 is configured to communicate using WLAN signaling, a WLAN signal may include WiFi, or other communication signals.

Figure 2:
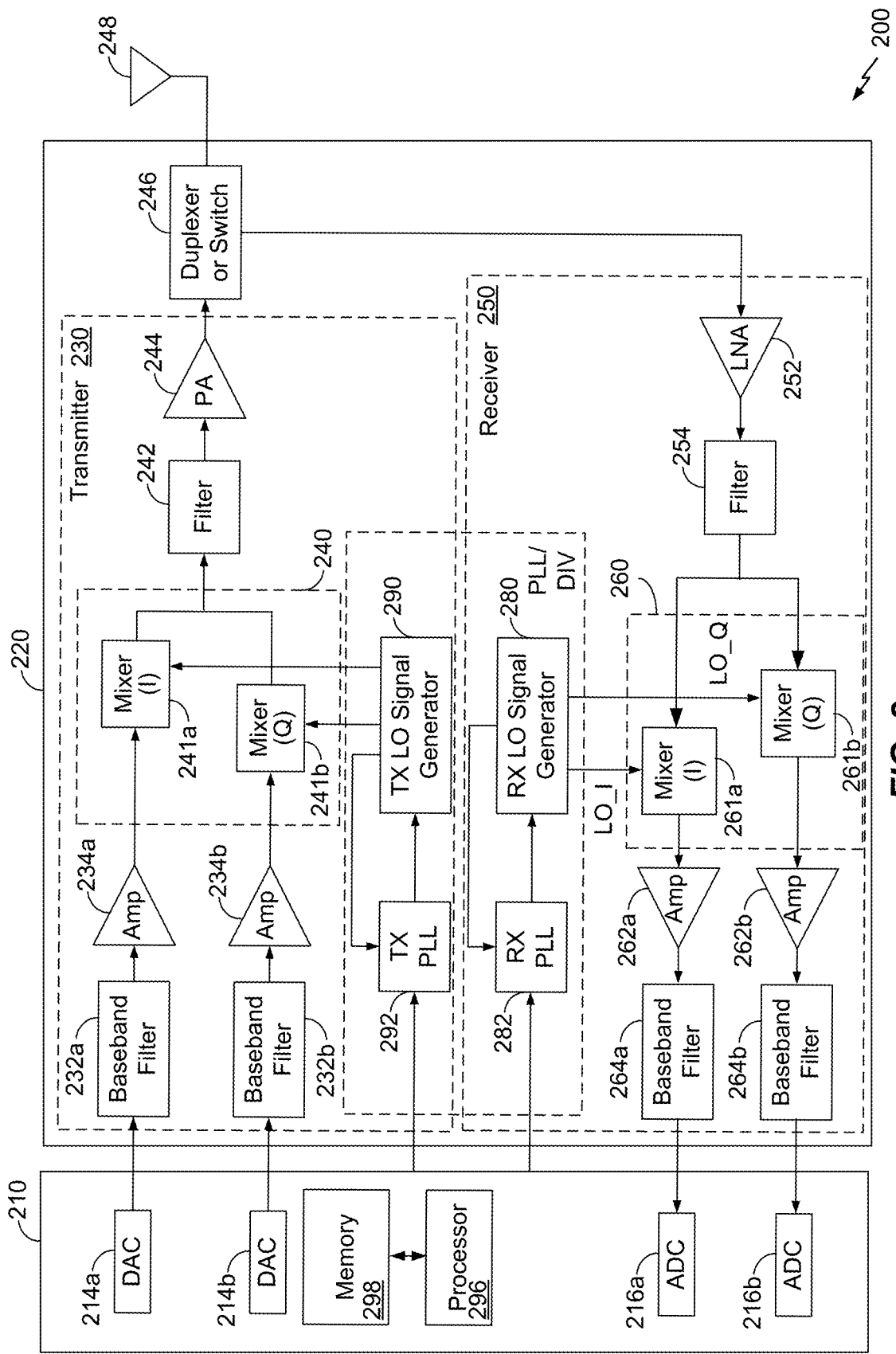
FIG. 2 is a block diagram showing portions of a wireless device in which aspects the present disclosure may be implemented.

FIG. 2 is a block diagram showing a wireless device 200 in which aspects of the present disclosure may be implemented. In particular, systems that supply power to a power amplifier (PA) 244 can include envelope tracking as described in more detail below. The wireless device 200 may, for example, be an embodiment of the devices (e.g., the base station 130 or 132, the wireless device 110 or 160, etc.) illustrated in FIG. 1. The circuitry described may be circuitry supporting wireless communications. In some examples, the wireless device 200 (or any of the devices described and/or illustrated hereinafter) may be an example of any of the devices illustrated in FIG. 1 or any other device described herein.

FIG. 2 shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, wireless device 200 generally comprises the transceiver 220 and a data processor 210. The data processor 210 may include a processor 296 operatively coupled to a memory 298. The memory 298 may be configured to store data and program codes, and may generally comprise analog and/or digital processing components. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214*a* and 214*b* for converting digital signals generated by the data processor 210 into the I and Q analog output signals, e.g., I and Q output currents, for further processing. In other embodiments, the DACs 214*a* and 214*b* are included in the transceiver 220 and the data processor 210 provides data (e.g., for I and Q) to the transceiver 220 digitally.

Within the transmitter 230, baseband (e.g., lowpass) filters 232*a* and 232*b* filter the I and Q analog transmit signals, respectively, to remove undesired images caused by the prior digital-to-analog conversion. Amplifiers (Amp) 234*a* and 234*b* amplify the signals from the baseband filters 232*a* and 232*b*, respectively, and provide I and Q baseband signals. An upconverter 240 having upconversion mixers 241*a* and 241*b* upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. The power amplifier 244 amplifies the signal from filter 242 to obtain the desired output power level and provides a transmit RF signal. The transmit RF signal is routed through a duplexer or switch 246 and transmitted via an antennas 248. While examples discussed herein utilize I and Q signals, those of skill in the art will understand that components of the transceiver may be configured to utilize polar modulation.

In the receive path, the antennas 248 receives communication signals and provides a received RF signal, which is routed through duplexer or switch 246 and provided to a low noise amplifier (LNA) 252. The switch 246 is designed to operate with a specific RX-to-TX duplexer frequency separation, such that RX signals are isolated from TX signals. The received RF signal is amplified by LNA 252 and filtered by a filter 254 to obtain a desired RF input signal. Down-conversion mixers 261*a* and 261*b* in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262*a* and 262*b* and further filtered by baseband (e.g., lowpass) filters 264*a* and 264*b* to obtain I and Q analog input signals, which are provided to data processor 210. In the exemplary embodiment shown, the data processor 210 includes analog-to-digital-converters (ADC's) 216*a* and 216*b* for converting the analog input signals into digital signals to be further processed by the data processor 210. In some embodiments, the ADCs 216a and 216b are included in the transceiver 220 and provide data to the data processor 210 digitally.

In FIG. 2, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Certain components of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the switch 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

In some aspects using a super-heterodyne architecture, the power amplifier 244, and the LNA 252 (and filter 242 and/or 254 in some examples) may be implemented separately from other components in the transmitter 230 and receiver 250. While wireless device 200 describes one example of a device, it will be apparent that aspects described herein can be implemented in other architectures (e.g., super-heterodyne architectures) power envelope tracking systems described are not limited to power amplifiers in architectures such as the architecture in the example of FIG. 2.

Figure 3A:
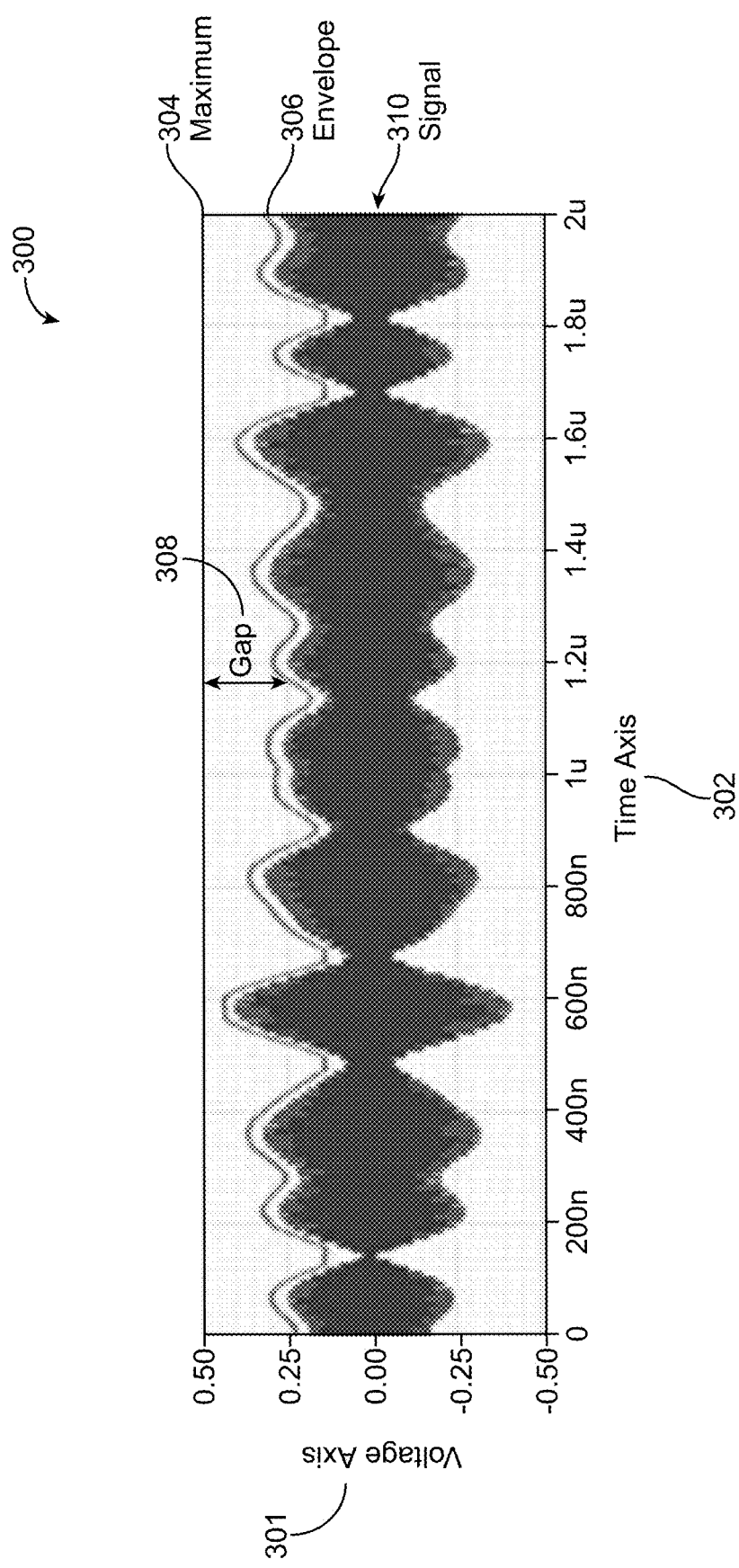
FIG. 3A is a chart illustrating power envelope tracking for an RFFE module, in accordance with aspects described herein.

FIG. 3A is a chart 300 illustrating power envelope 306 tracking for an RFFE module, in accordance with aspects described herein. As illustrated by power amplifier 244 of FIG. 2, wireless communication devices include amplification to control output power on an antenna (e.g., the antenna 248). The actual power provided at the antenna as part of a transmission can vary widely based on operating conditions and the particular application. The power supply for such an output power amplifier can be a significant source of wasted power, particularly when a current transmit power does not match the power made available by systems supplying power to the amplifier.

The chart 300 of FIG. 3A includes a time axis 302 and a voltage axis 301. The chart 300 illustrates example operating conditions for such an output power amplifier (e.g., the power amplifier 244), with a maximum voltage 304 supported by a system, the signal 310 voltage used by the power amplifier at a given point in time to support the transmission signal, and a voltage envelope 306 illustrating the voltage used by the signal 310 voltage to support signal performance. The gap 308 illustrates the difference between the maximum voltage 304 and the voltage envelope 306 associated with the voltage used by a power amplifier at a given point in time. The envelope 306 can be considered the voltage needed to support adequate signal performance at a given point in time. If the system provides less voltage to an amplifier than is needed for the signal 310 voltage, the integrity of the signal is damaged, and will result in corruption of transmitted data.

As the provided voltage increases, power dissipation increases, regardless of the voltage actually used by the power amplifier for a transmission signal. The gap 308 represents excess power usage associated with a device providing a high voltage than is needed to support a transmission signal at any given time. Given the importance of power efficiency for wireless communication devices, particularly mobile devices that operate with a limited battery, limiting such a gap and associated excess power dissipation is an important design goal.

Figure 3B:
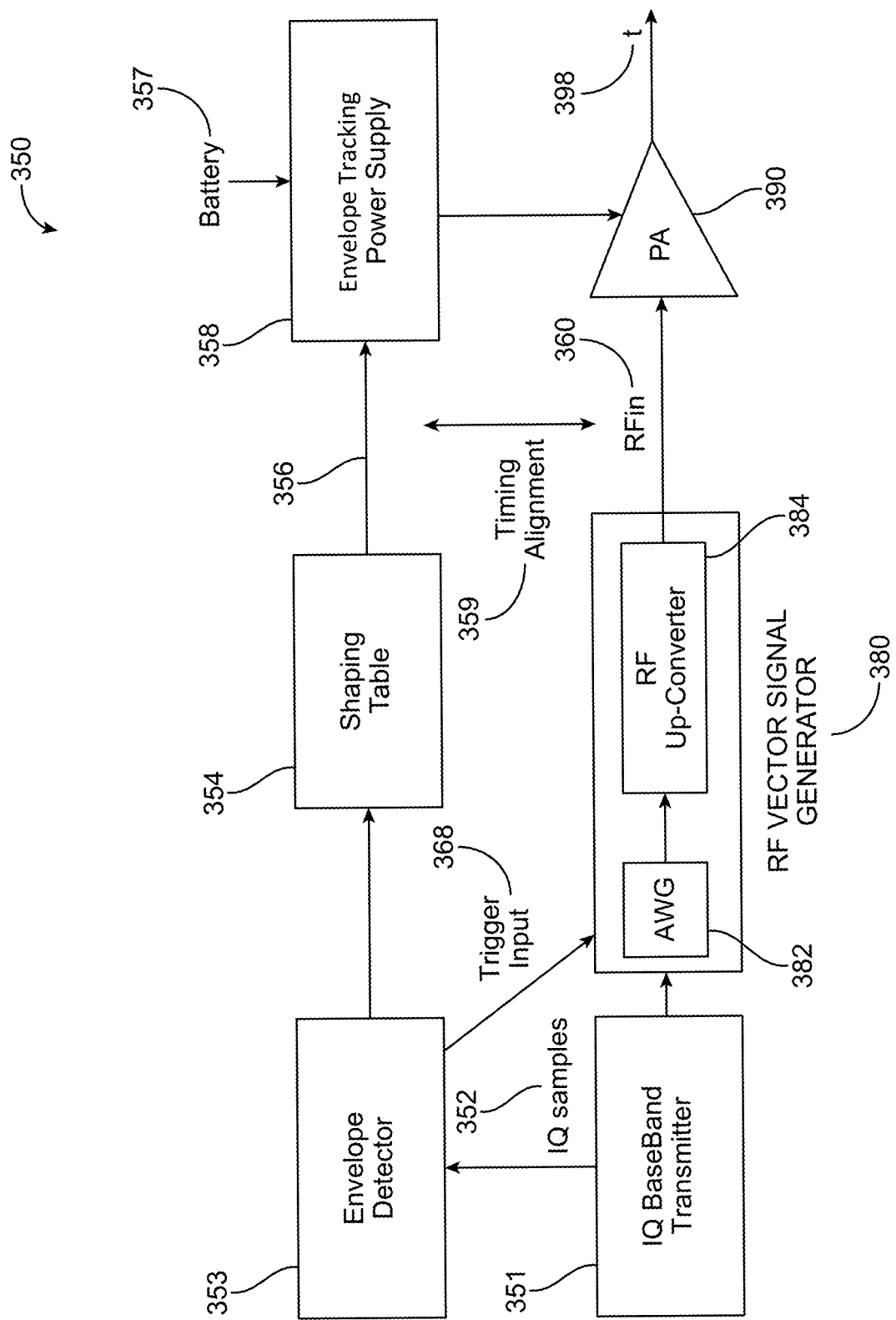
FIG. 3B is a high level block diagram of a system for power envelope tracking for an RFFE module, in accordance with aspects described herein.

FIG. 3B is a high-level block diagram of a system 350 for power envelope tracking for an RFFE module, in accordance with aspects described herein. The system 350 includes a power amplifier which can be similar to the power amplifier 244 described above, with an envelope tracking power supply 358 that operates to limit excess power dissipation associated with a gap such as the gap 308 of FIG. 3B above.

To perform envelope tracking and match the voltage provided to the power amplifier 390 to the voltage used by a signal at a given time, a baseband transmitter 351 provides signal samples 352 to an envelope detector 353. The envelope detector 353 outputs an envelope value to a shaping table 354 that outputs an envelope signal. The envelope signal 356 is input to the power supply 358 and used with power from a battery 357 to match the voltage associated with the envelope of the transmission signal to the voltage provided to the power amplifier 390.

As the envelope signal 356 is provided to the power supply 358, a trigger input 368 from the envelope detector 353 is used to align a timing of the analog envelope signal and the voltage provided from the power supply 358 to a RF input 360 signal provided to the power amplifier 390 and an associated transmission signal at RF output 398. The RF input 360 is generated by an RF vector signal generator 380, which includes a waveform generator 382 and an RF upconverter 384. The waveform generator 382 generates a low frequency version the waveform to be transmitted from samples provided by the baseband transmitter 351. The low frequency waveform is upconverted to the transmission frequencies by the RF upconverter 384 and provided to the RF input 360 for amplification by the power amplifier 390.

The voltage provided to the PA 390 by the envelope tracking power supply 358 can thus match the envelope 306 illustrated in FIG. 3A. The timing alignment 359 between the envelope signal 356 and the RF input 360 prevents the envelope signal 356 from being out of alignment with the signal 310, which would result in signal clipping and errors at the RF output 398 (e.g., if the envelope 306 was shifted left or right while the signal 310 maintained position). Additional details related to implementations of the timing alignment 359 and the envelope tracking power supply 358 in accordance with aspects described herein are provided below.

Figure 4A:
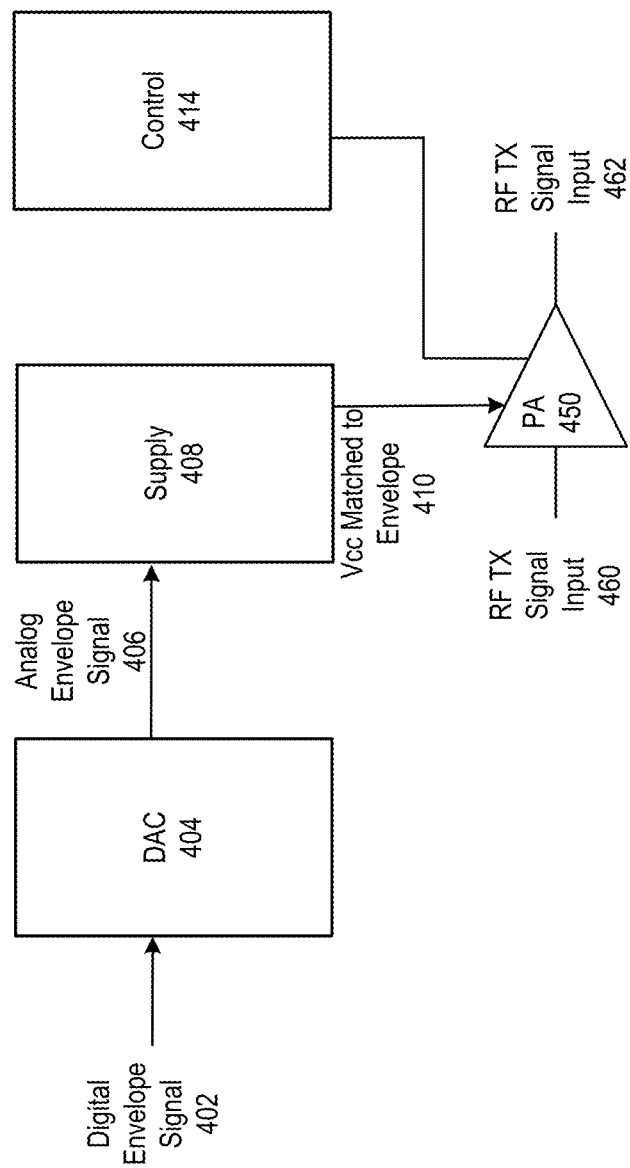
FIG. 4A is a block diagram showing aspects of a system for using power envelope tracking to control the power supplied to an RFFE power amplifier, in accordance with aspects described herein.

FIG. 4A is a block diagram showing aspects of a system 400 for using power envelope tracking to control the power supplied to an RFFE power amplifier, in accordance with aspects described herein. The system 400 can be an implementation of the envelope tracking power supply 358 of FIG. 3B, where the envelope signal 356 is provided to the envelope tracking power supply 358 as a digital envelope signal 402. In the system 400, the digital envelope signal 402 is provided to a digital to analog converter (DAC) 404, which outputs an analog envelope signal 406. The analog envelope signal 406 is provided to a supply source 408, which outputs a voltage VCC 410 which is matched with an envelope of the RF signal provided at an RF transmission signal input 460, and synchronized and to have the VCC provided to a power amplifier 450 matching a voltage needed at the RF transmission signal output 462.

During operation, depending on the dynamic range or operating conditions present in the signal provided at the input 460, control circuitry 414 can alter operational settings of the power amplifier 450. Similarly, the supply source 408 can, in various implementations as described below, include various structures for responding to the specifics of a particular transmission signal. For example, in one implementation, the analog envelope signal 406 can be provided to an amplifier that outputs a signal tracking dynamic aspects of the voltage 410, with a sensing circuit coupled to an output of the amplifier to track direct current aspects of the voltage 410. A switcher can be used to set the direct current level of the voltage 410, and the output of the switcher and the amplifier can be combined to provide the voltage 410 at a level that tracks the envelope of the signal being amplified by the power amplifier 450. In various implementations, additional circuitry can be included in the system 400, such as additional control circuitry for responding to device operating conditions, protection circuitry, signal interference suppression circuitry to minimize propagation of spurious signals through the voltage supply, or other such circuitry.

In some implementations, the control circuitry 414 can include a boost converter or other such elements can be used to manage voltages in accordance with aspects described herein when a battery level is low. Aspects described herein, while not specifically illustrated with such boost converter elements, can include additional battery level and power management features in combination with aspects described herein to manage power use at all stages of a battery supply level for an apparatus including aspects described herein.

Figure 4B:
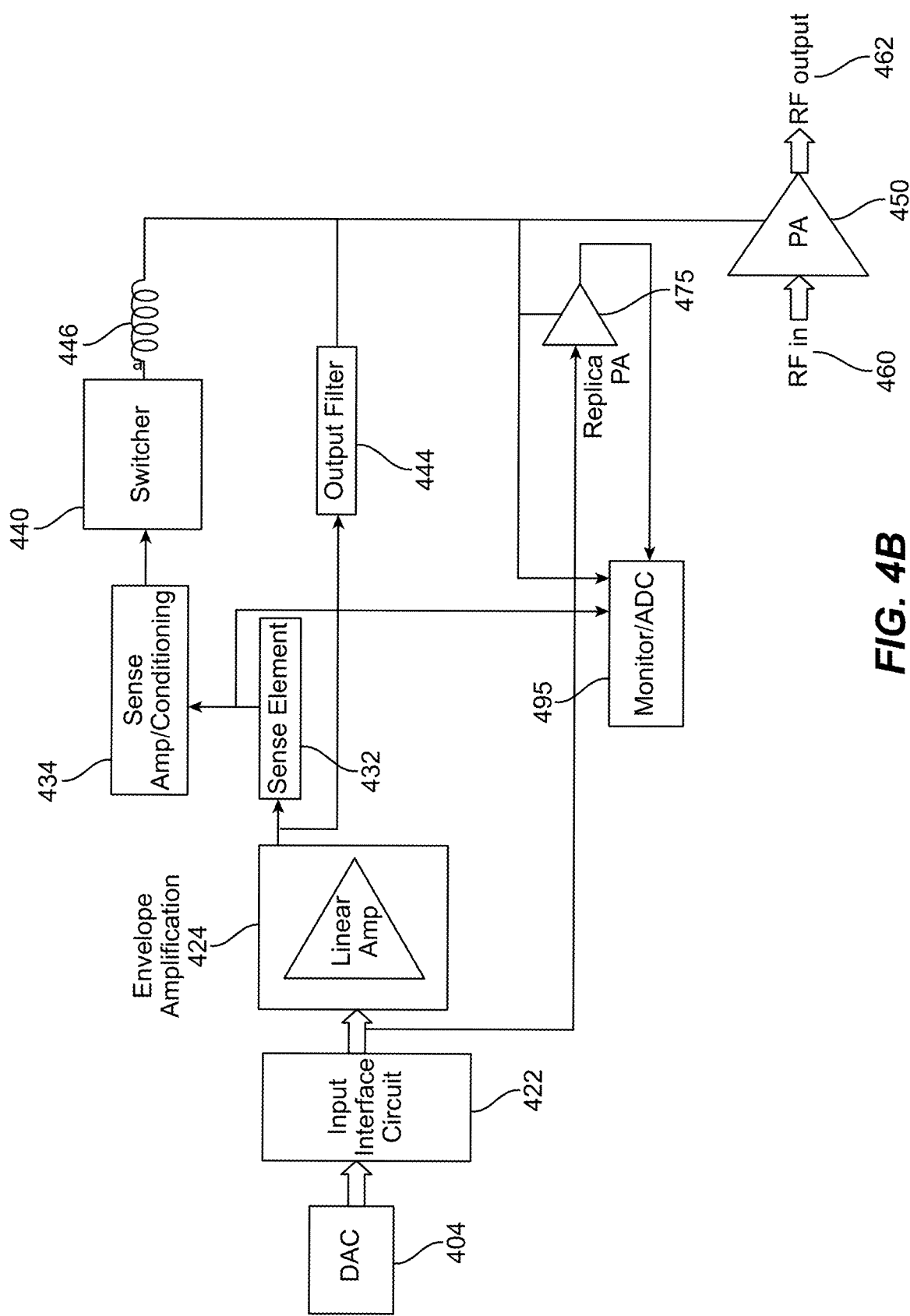
FIG. 4B is a block diagram showing aspects of a system for using power envelope tracking to control the power supplied to an RFFE power amplifier, in accordance with aspects described herein.

FIG. 4B is a block diagram showing aspects of a system for using power envelope tracking to control the power supplied to an RFFE power amplifier, in accordance with aspects described herein. In the illustrated example of FIG. 4B, the RF input 460, the RF output 462, and the power amplifier 450 are the same as illustrated in FIG. 4A. A digital to analog converter (DAC) 404 receives a digital envelope signal, which can be generated by a modem or other circuitry using information about a wireless communication signal to be transmitted via a power amplifier 450. The DAC 404 provides an envelope signal to an input interface circuit 422, which translates or modifies the signal from the DAC 404 for input to amplification circuitry 424. In the example of FIG. 4B, the amplification circuitry 424 includes a single linear amplifier. In other implementations as described below, other configurations of amplification circuitry can be used. As described herein, the linear amplifier can provide a voltage signal to the power amplifier 450 at higher frequencies of an envelope (e.g., the higher frequency parts of the envelope 306) more efficiently than those portions of the envelope can be provided by a switcher 440, while the lower frequency parts of the envelope can be provided more efficiently by the switcher 440. The higher frequency portions of the voltage provided by the amplification circuitry 424 are coupled to the power amplifier via an output filter 444 that can pass alternating current (AC) components and filter unwanted elements from the voltage signal that can impact a wireless communication signal (e.g., used to generate the envelope signal) that is amplified by the power amplifier 450. A sense element 432 taps the output of the amplification circuitry, and provides a low frequency tracking signal to sensing and conditioning circuitry 434. The sensing and conditioning circuitry 434 uses the tracking signal to provide an input to the switcher 440, which provides power (e.g., current at the envelope voltage) for low frequency components of the voltage signal provided to the power amplifier. Element 446 passes the low frequency direct current (DC) components of the voltage signal similar to the output filter 444 operation for AC components. The filter 444 and the element 446 work on different frequency regions of the spectrum to protect the pass the signal being amplified by the power amplifier.

In FIG. 4B, the system additionally includes tracking circuitry in the form of a replica power amplifier 475 and monitoring circuitry 495. The replica power amplifier is a configured to provide performance that tracks the performance of the power amplifier 450, including a similar input signal to the signal amplified at a radio frequency (RF) input 460 and a radio frequency output 462. Rather than tapping the signals at the RF input 460 and the RF output 462 of the power amplifier 450, which would impact performance, the replica power amplifier 475 can provide duplicate signals that match or correlate with the signals at the power amplifier 450. The signals output from the replica power amplifier 475, however, are provided to the monitoring circuitry 495 as state tracking data. In the system 400B, the state tracking data includes an RF output signal from the replica power amplifier 475, the voltage signal provided by the combined output of the switcher 440 and the amplification circuitry 424, and the tracking signal output from the sensing element 432. In other implementations, other state tracking data or additional state tracking data can be used, such as device temperature, battery state (e.g., capacity), or any other such information that can impact envelope tracking power supply operation. The state tracking data can be used in a variety of ways, including storage for analysis and use in offline updates to control systems used in improving operation of devices, networked updates to control system used in operation of devices, and as feedback data for machine learning circuitry used to manage control inputs to an envelope tracking power supply in accordance with aspects described herein.

Figure 4C:
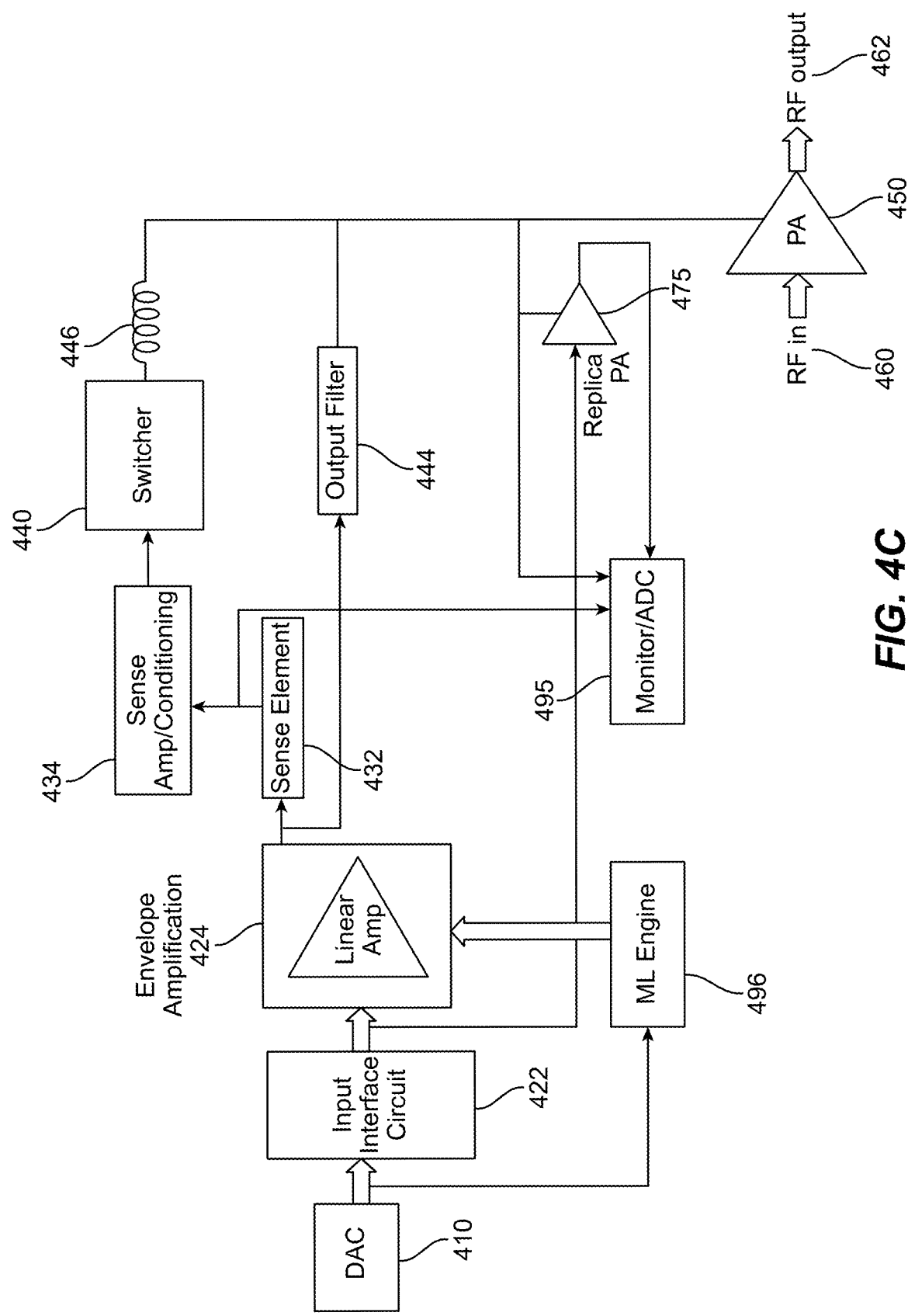
FIG. 4C is a block diagram showing aspects of a system for using power envelope tracking to control the power supplied to an RFFE power amplifier, in accordance with aspects described herein.

FIG. 4C is a block diagram showing aspects of a system 400 for using power envelope tracking to control the power supplied to an RFFE power amplifier 450, in accordance with aspects described herein. In the illustrated example of FIG. 4B, the RF input 460, the RF output 462, and the power amplifier 450 are the same as illustrated in FIG. 4B, with an added machine learning circuitry 496. The machine learning circuitry 496 can accept the state tracking data from the monitoring circuitry 495, an envelope tracking signal from the DAC 404, and any other data from system operation in order to track performance quality and responsiveness under different operating conditions. The machine learning circuitry 496 can then provide control inputs to the amplification circuitry 424 to improve performance based on the state tracking data and other such aspects of prior operation used to train the machine learning circuitry 496.

The machine learning circuitry 496 can provide adaptive real-time monitoring of the power use and performance of the power amplifier 450. The monitoring circuitry 495 can provide real-time data related to the power amplifier 450 operation to the machine learning circuitry 496. For example, the device operations for generating the envelope tracking signal used to generate the voltage that powers the power amplifier 450 is generated from shared data used to generate a wireless communication signal amplified provided to the RF input 460 of the power amplifier 450 are generated using different processes, and having paths with different timing to reach the power amplifier 450. Additionally, characteristics of the data can result in significantly different characteristics for the envelope tracking signal and the wireless communication signal in different circumstances. Such differences can impact performance of a wireless communication device, particularly power consumption and bit error rates. Because of the operating principles described above, improvements in power performance (e.g., reduced power usage associated with a smaller gap 308) can result in decreased signal performance (e.g., an increase in error rates). The machine learning circuitry 496 can track power consumption and error rates under different operating conditions. The operating conditions can include control signal conditions (e.g., certain settings for amplification circuitry 424 operations and switcher 440 operations), communication signal conditions (e.g., certain frequencies, amplitudes, or bit patterns in a wireless communication signal), and envelope signal conditions (e.g., patterns, frequencies, and amplitudes in the voltage level provided to the power amplifier 450 by envelope tracking systems described herein). The machine learning circuitry 496 can then match the real-time operating conditions to preferred power and signal performance results to dynamically generate improvements in real-time performance of a wireless communication apparatus.

Figure 5A:
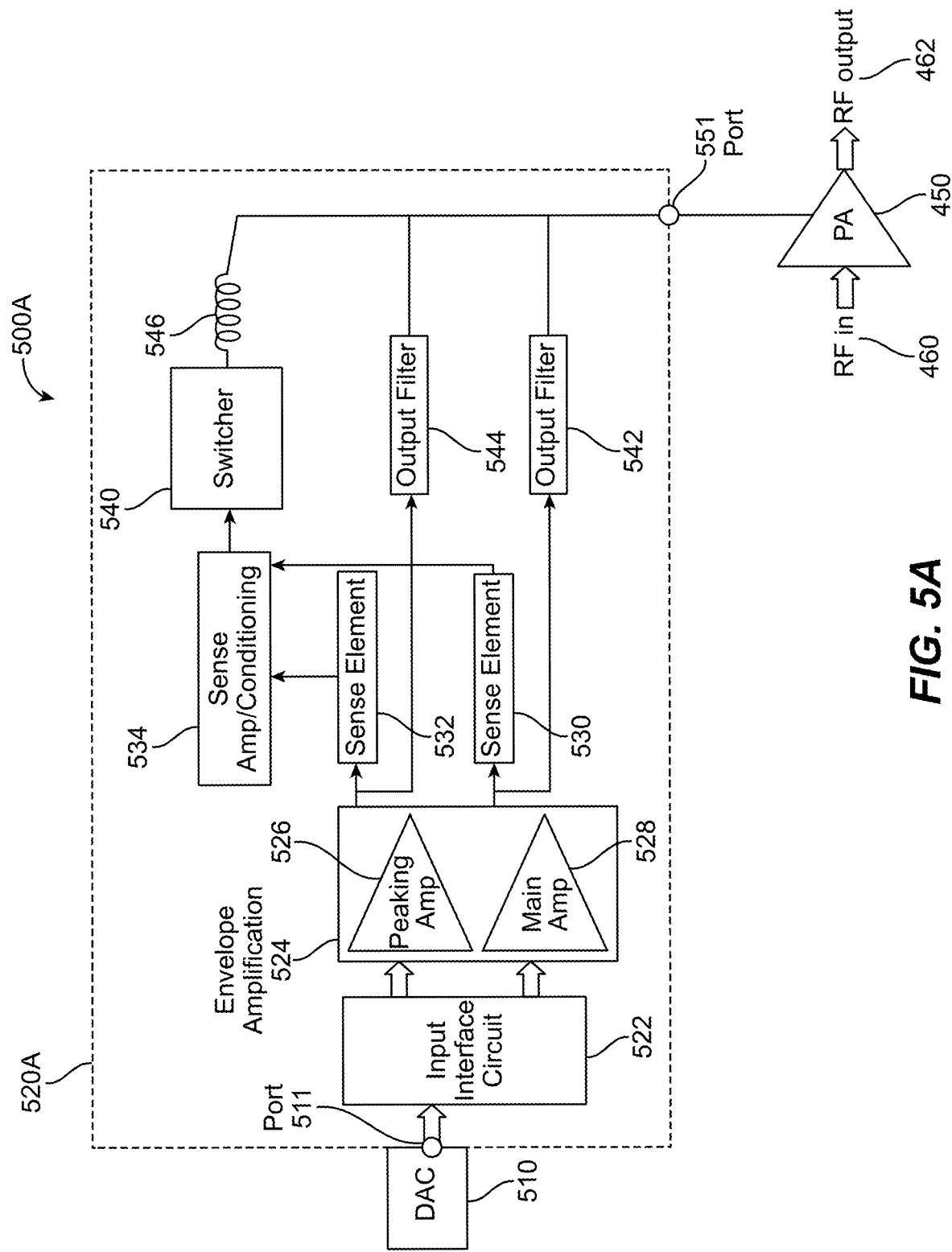
FIG. 5A is a block diagram showing aspects of a system for using power envelope tracking to control the power supplied to an RFFE power amplifier, in accordance with aspects described herein.

FIG. 5A is a block diagram showing aspects of a system 500A for using power envelope tracking to control the power supplied to an RFFE power amplifier 450, in accordance with aspects described herein. In the illustrated example of FIG. 5A, the RF input 460, the RF output 462, and the power amplifier 450 are the same as illustrated in FIG. 4A, but a second amplifier is used in generating the envelope tracking voltage used in powering the power amplifier 450.

The envelope tracking power supply 520A includes at least two amplifiers as part of amplification circuitry 524. In the illustrated example of FIG. 5A, the amplification circuitry 524 includes a first amplifier 528 and a second amplifier 526. As described above, the DAC 510 can receive a digital envelope signal, and provide an analog envelope signal to the envelope tracking power supply 520A at an input port 511. The input port 511 is coupled to an input interface circuit 522. The input interface circuit provides both a tracking signal matching the analog envelope signal to the amplification circuitry 524, as well as a control input.

The first amplifier 528 can, in some implementations, be a main amplifier that tracks the analog envelope signal by itself under standard or low demand operating conditions. The second amplifier 526 can be a peaking amplifier that is off during low demand or standard operating conditions, but that turns on to support peak voltage conditions, high frequency envelope changes, or other operating conditions that are beyond the response capacity of the first amplifier 528 operating alone. The second amplifier can be set to an off condition when the standard operating conditions are present and turned on when needed by a control signal from amplifier controls. In some implementations, the control signal can be generated by the amplifier control circuitry integrated with a modem or machine learning circuitry based on characteristics of the analog envelope signal provided the input port 511 via the DAC 510. In other implementations, the amplifier control circuitry can be configured as feedback circuitry that receives a signal from conditioning circuitry 534. In other implementations, the input interface circuit 522 can integrate control circuitry to provide the control for the second amplifier 526. In any case, processing circuitry an provide a control signal indicating conditions for setting the second amplifier 526 in an on or an off state based on characteristics of the analog envelope signal.

The first amplifier 528 has an input and an output with the input coupled to the tracking signal from the input interface circuit 522, and the output providing a voltage signal to an output filter 542. During operating conditions where the second amplifier 526 is in the off state, the output of the first amplifier 528 provides a voltage output to the output filter 542, which can filter any spurious signals or reduce noise from the output of the first amplifier 528. The voltage signal output from the output filter 542 is then provided as the dynamic portion of the VCC voltage provided to the power amplifier 450 via an output port 551 of the envelope tracking power supply 520A. The output of the first amplifier 528 is additionally tapped by a connection to a sensing element 530. The sensing element 530 provides a value tracking the output signal from the first amplifier 528 to sensing and conditioning circuitry 534. The sensing and conditioning circuitry 534 can provide feedback via amplifier control circuitry to the envelope amplification circuitry 524 to adjust the control settings, and can also provide a direct current (DC) control signal tracking a direct current portion of the target VCC value to be output at the output port 551. The DC control tracking signal is input to the switcher 540, which outputs a DC portion of the VCC value via element 546. The element 546 can, in some implementations, be an inductor configured to filter noise from the DC portion of the VCC value. In other implementations, more complex filtering circuitry can be used at the output of the switcher 540. The combined output of the switcher 540 and the output filter 542 provide a VCC voltage value at the output port 551 that tracks the voltage used by the power amplifier 450 to create a transmission RF signal at the RF output 462 to be transmitted via an antenna. As described above, adjusting the VCC value for the power amplifier 450 reduces unnecessary power dissipation which occurs when the VCC value provided to the power amplifier 450 is significantly more than what is needed for the transmission signal.

As described above, when the second amplifier 526 is off, the output from the second amplifier does not contribute to the VCC value provided to the output port 551 and to the power amplifier 450. When feedback determines that the first amplifier 528 is not able to track the envelope signal to provide an acceptable voltage at the output port 551, the second amplifier 526 is set to an on state, and operates similar to the output path from the first amplifier 528. A peaking input signal is provided to an input of the second amplifier, and a peaking voltage signal is output from an output of the second amplifier 526. The peaking voltage signal is filtered through an output filter 544, and combined with the voltage signals from the switcher 540 and the output filter 542 (e.g., from the first amplifier 528). The peaking voltage signal, when combined with the other signals, can provide higher performance responsiveness and/or power when compared to operation without the peaking voltage signal from the second amplifier 526. Similarly, a sensing element 532 tap at the signal from the output of the second amplifier 526 is provided to the circuitry 534, and can update or modify both the DC control signal provided to the switcher 540 and a feedback signal processed via the feedback circuitry implemented as amplifier control circuitry based on characteristics of the peaking voltage signal from the output of the second amplifier 526.

Additionally, the configuration option to set the second amplifier 526 to an off state conserves power, such that power consumed by the second amplifier 526 is less than power consumed by amplification circuitry 524 with a single linear amplifier combined with any excess power dissipation caused by additional voltage headroom (e.g., a larger gap such as the gap 308) provided to the power amplifier 450 via the output port 551.

As described above, in various implementations, control circuitry is used to manage the addition of the second amplifier 526 (e.g., the peaking amplifier) into the circuitry that contributes to the voltage provided the power amplifier 450 can be controlled in different ways. In some implementations, the input interface circuit 522 includes control circuitry to monitory the most significant bits provided to the DAC 510 using an input of the digital envelope signal. When the most significant bits are active (e.g., indicating a high voltage value), the second amplifier 526 can be turned on. In still further implementations, a most significant bit of the digital envelope signal can be used directly to turn on the peaking second amplifier 526, without additional processing circuitry. In some implementations, a control signal can be provided from modem circuitry based on envelope tracking data synchronized to the control of the second amplifier 526 to determine when the second amplifier is turned on or off.

Figure 5B:
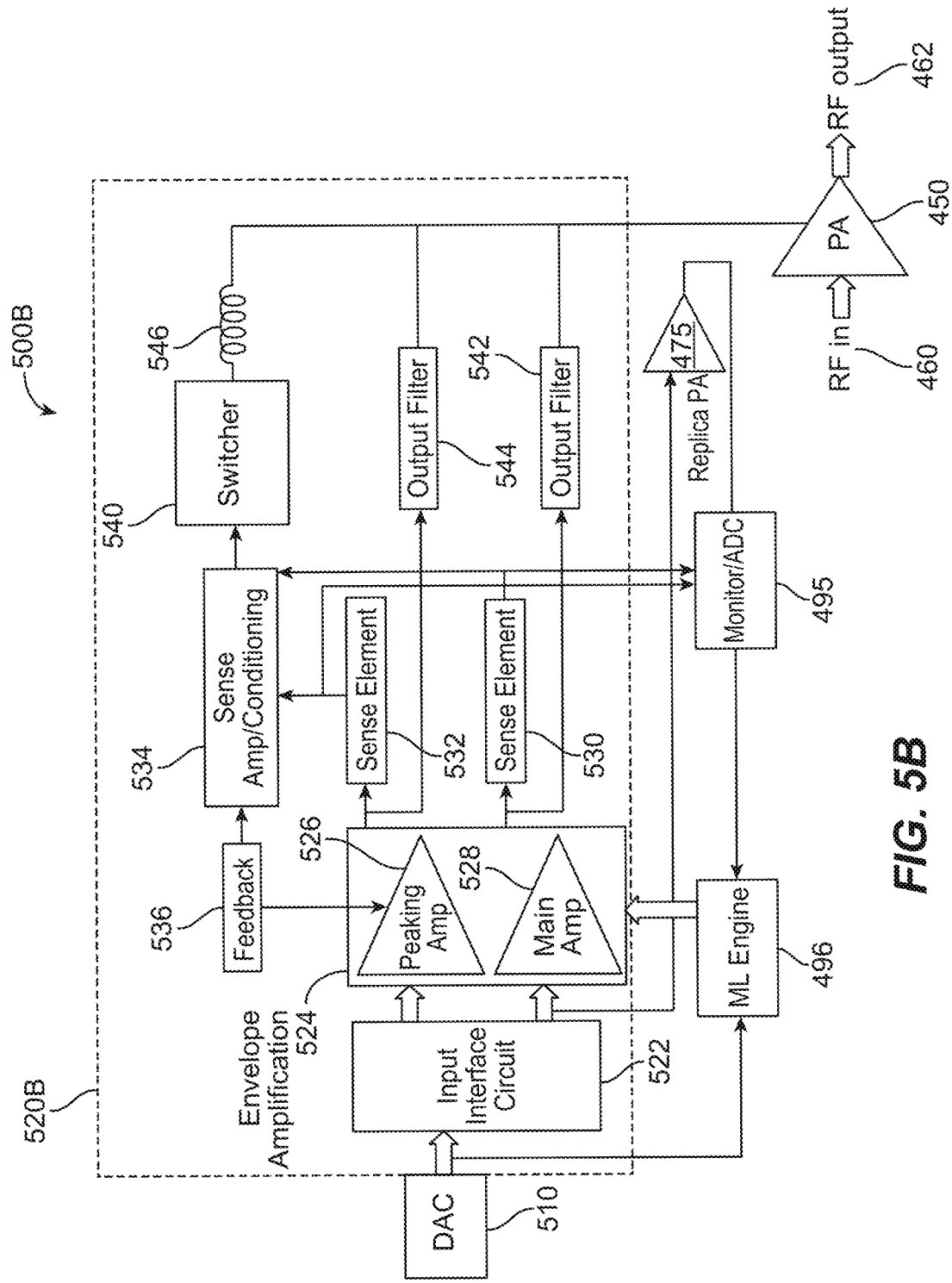
FIG. 5B is a block diagram showing aspects of a system for using power envelope tracking to control the power supplied to an RFFE power amplifier, in accordance with aspects described herein.

FIG. 5B then illustrates the system 500A of FIG. 5A modified as system 500B with monitoring and machine learning circuitry 496 control of the operation of the envelope tracking power supply 520B. As described above with respect to FIG. 4C, the machine learning engine can provide adaptive real-time monitoring of the power use and performance of the power amplifier 450. The monitoring circuitry 495 can provide real-time data related to the power amplifier 450 operation to the machine learning circuitry 496. In addition to the state tracking data described in the single amplifier version of FIG. 4C, the monitoring circuitry 495 will include tracking signals from the sensing elements 532 and 530 to track state data for the outputs of both the first amplifier 528 and the second amplifier 526. Just as descried above, the machine learning circuitry 496 can track power consumption and error rates under different operating conditions, including differences in operation when the second amplifier 526 is in an off state verses an on state.

Further, in addition to including the replica power amplifier 475 and the monitoring circuitry 495 for real-time tracking of performance during operation, the DAC 510 can include calibration circuitry that can create test signals using test envelope tracking signals with predefined characteristics (e.g., set frequencies for the test envelope signal) in order to set initial operating conditions prior to real-time adjustments occurring using the machine learning circuitry 496. During a self-calibrating mode, the power amplifier 450 can be disabled and the replica power amplifier 475 can be enabled to provide calibration data. The DAC 510 can provide a test envelope signal with first characteristics (e.g., a 100 megahertz (MHz) frequency at a first power level), and the monitoring circuitry can record first state tracking data with the first amplifier 528 enabled and the second amplifier 526 disabled, second state tracking data with the first amplifier 528 disabled and the second amplifier 526 enabled, and third tracking data with both amplifiers 526 and 528 enabled. Such measurements can then be repeated for other test envelope signal characteristics. The state tracking data stored by the monitoring circuitry 495 can be used to perform an initial tuning of the initial control settings or an initial state for machine learning circuitry 496.

In some implementations, the initial settings can be stored in a state-machine as part of the machine learning circuitry 496 locally as part of the envelope tracking power supply 520B. In other implementations, the initial settings or aspects of real-time updates as part of the machine-learning circuitry 496 can be integrated with modem circuitry, transceiver circuitry, specialized machine learning systems, or other systems within any part of a wireless communication apparatus that includes an envelope tracking power supply with integration of machine language controls.

Such calibration operations can be implemented with any aspect described herein, including envelope tracking power supplies with a single amplifier, with multiple amplifiers, or with any configuration operating in accordance with aspects described herein.

Additionally, in FIG. 5B, the feedback controls include not only the controls as part of the machine learning circuitry 496, but also feedback control circuitry 536 that is not directly integrated with the machine learning circuitry. In some implementations, the control circuitry 536 is implemented with a feedback connection directly from the sense amplification and conditioning circuitry 534. Such a feedback signal from the conditioning circuitry 534 has a benefit of being closely coupled to the voltage signal. At high frequency operation, such a close feedback connection can improve the tracking of the envelope to the transmission signal, limit errors or noise in the difference between the envelope and the transmission signal, and allow a smaller gap (e.g., the gap 308) with an associated reduction in dissipation power for the gap between the voltage provided to the power amplifier and the voltage used by the power amplifier. With feedback directly from conditioning circuitry, current, voltage, or power coming directly from either the first amplifier 528 or the second amplifier 526 can be directly measured and compared with the target envelope match. Such feedback can be used in directly determining control set points where amplifiers operate (e.g., where the second amplifier is turned on and off), and to directly correct mismatches between expected output(s) and voltage values at the output port 551. In some implementations, the separate control systems can both operate, with the control circuitry 536 providing a tightly integrated and fast response integrated with the envelope tracking to provide high frequency adjustments to operation, and machine learning controls can provide a secondary lower frequency feedback and control adjustment.

In some implementations, the use of the second amplifier 526 in parallel with the first amplifier 528 allows different structures for different applications. In some implementations the first amplifier 528 and the second amplifier 526 have a similar or same interfaces with the input interface circuit 522 duplicated for the two amplifiers. In other implementations, different amplifiers are used and can be configured based on the particular characteristics of each amplifier. For example, in some implementations, rather than using a control signal to turn the second amplifier 526 on and off, in some implementations, the input interface circuit 522 can be provided two separate signals, one derived from the most significant bits of the digital envelope signal, and one derived from the least significant bits of the digital envelope signal. The signal derived from the most significant bits can drive the second amplifier 526, and the signal derived from the least significant bits can drive the first amplifier 528. In other implementations, the modem can provide separate signals for different amplifiers of the amplification circuitry 524.

In some such implementations, the second amplifier 526 can have lower linearity, since it operates at higher output ranges, and the first amplifier 528 may have greater linearity for operating at lower output ranges. In addition to the examples described above, some implementations of envelope amplification circuitry include a common stage between input interface circuitry and amplification circuitry. Such a common stage can function as an additional analog partitioning at the input of the amplification circuitry. In some configurations, amplifiers of amplification circuitry 524 are designed for multi-stage circuitry. Some such circuitry includes smoothing functions to manage filtering or interface aspects of the amplifiers to digital inputs. The common stage can, in some implementations, provide signal performance benefits managing such smoothing of signals and managing the signal inputs to the separate amplifiers.

In some implementations, the first amplifier 528 in a multi-amplifier implementation can be a class-AB amplifier (e.g., an amplifier with greater linearity) and the second amplifier 526 can be a class-C amplifier, providing design flexibility and component options while maintaining envelope tracking performance. In some implementations, the second amplifier 526 operating as a peaking amplifier can be a switch-mode amplifier such as a class-E, class-G, or class-H amplifier. Some such amplifiers can, for example, be used in a switching configuration, such as when the most significant bit or bits are used as a threshold or other bits are used with threshold circuitry to activate the second amplifier 526 operating as a threshold activated switching amplifier operating at saturation for high efficiency. In such an implementation, the first amplifier 528 can provide any needed linearity, with the second amplifier 526 only operating at saturation to provide a boost needed to achieve higher voltage levels at the output port with a corresponding connection to the power amplifier 450.

Figure 6A:
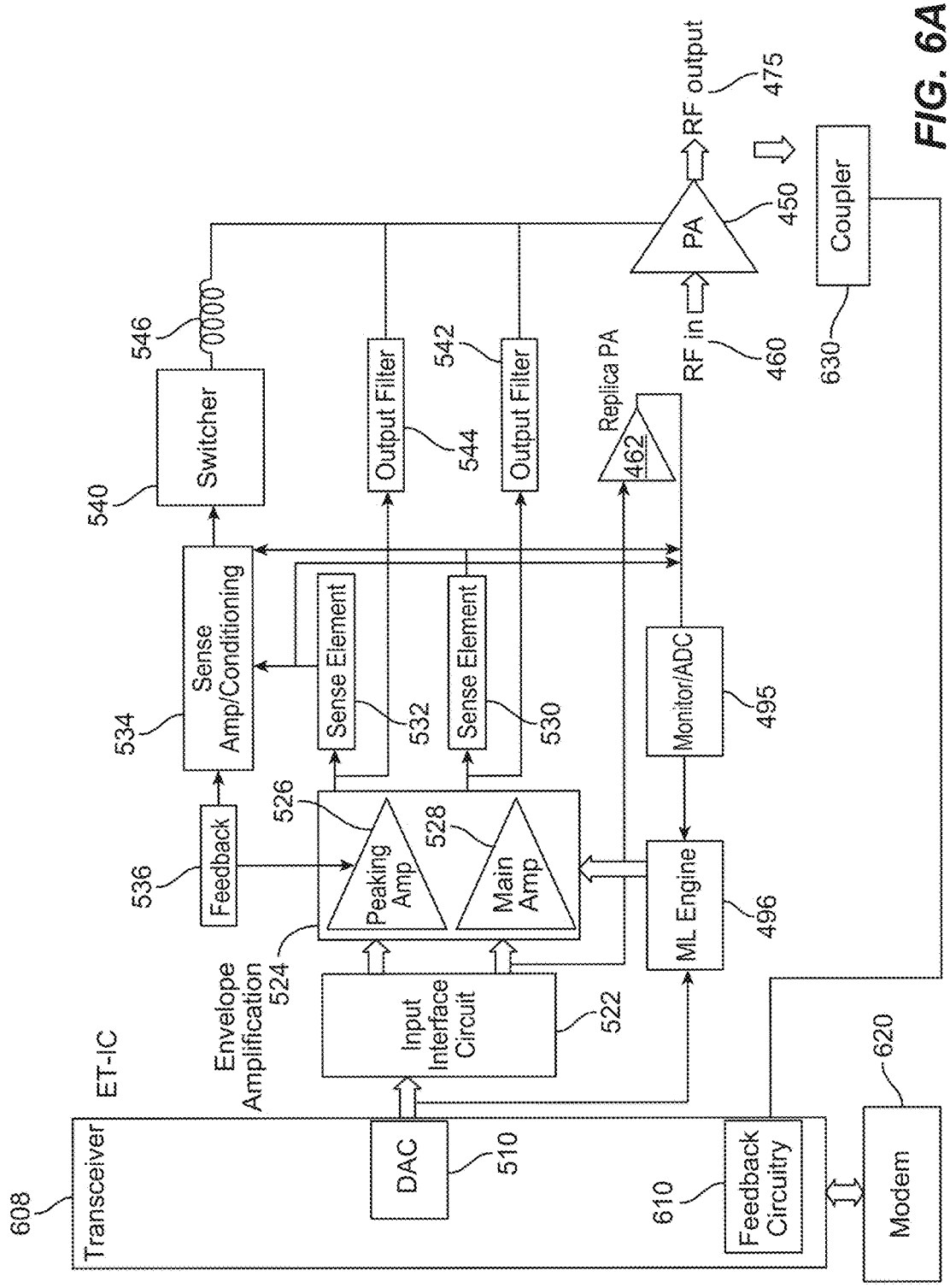
FIG. 6A is a block diagram showing aspects of a system for using power envelope tracking to control the power supplied to an RFFE power amplifier, in accordance with aspects described herein.

FIG. 6A is a block diagram showing aspects of a system 600A for using power envelope tracking to control the power supplied to an RFFE power amplifier, in accordance with aspects described herein. The system 600A includes the same elements as FIG. 5B, but with the additional system elements of transceiver 608, modem 620, and coupler 630. The coupler 630 can provide a feedback signal describing the operation of the power amplifier 450, which can be used as additional feedback to provide additional state tracking data to the monitoring circuitry 495 and the machine learning circuitry 496. The coupler 630 can, for example, be an element coupled to the output of the power amplifier 450 to tap a small amount of the signal or otherwise measure the signal at the output of the power amplifier 450. The signal measured using the coupler can be provided to the monitoring circuitry 495 or any other such circuitry to provide feedback or tracking data. The coupler 630 can be configured to limit the impact of the sensing on the wireless communication signal output from the power amplifier 450, to limit the noise, power loss, or other signal degradation prior to the wireless communication signal output from the power amplifier 450 being transmitted via an antenna. The additional state tracking data from the coupler 630 can further improve real-time performance tracking of the envelope signal, and management of the control input to prevent the amplification circuitry of the envelope tracking power supply from wasting power with excess current into the power amplifier 450 or causing error rates by failing to provide an adequate voltage to the power amplifier 450. The series feedback from the coupler 630 can allow the amplification circuitry to provide the voltage tracking the envelope with the current needed for the power amplifier 450 coming from a more efficient source in the form of the switcher 540 (e.g., as the PA appears as a high resistance, rather than a low resistance in the 10 ohm range which would require a large current to maintain the envelope tracking voltage). The coupler 630 can provide feedback via feedback circuitry 610 of the transceiver 608, coupled with controls from the modem, to provide a signal to the switcher 540 to efficiently provide the current needed for operation of the power amplifier 450 (e.g., matching the tracking envelope). Such additional state tracking data can be included in the calibration operations described above. Additionally, in some aspects, machine learning circuitry can match aspects of state tracking data to control signals to provide long term learning and adjustments to the control signals. For example, error states can be identified and associated with certain operating conditions and control signals, and the machine learning circuitry can be used to identify such conditions and adjust the control signals used under identified conditions to avoid error states (e.g., states where insufficient voltage is provided to the power amplifier).

Figure 6B:
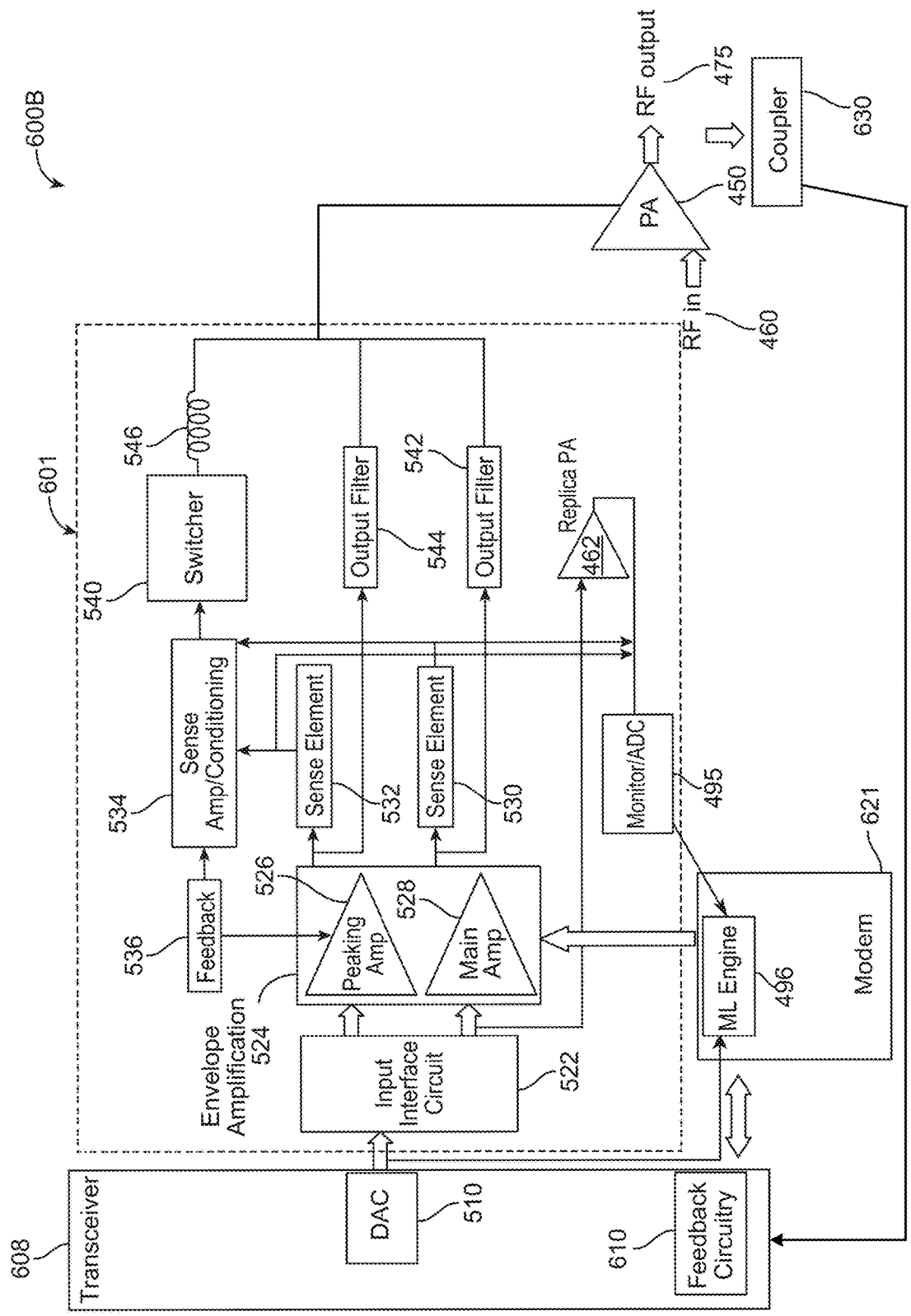
FIG. 6B is a block diagram showing aspects of a system for using power envelope tracking to control the power supplied to an RFFE power amplifier, in accordance with aspects described herein.

FIG. 6B is a block diagram showing aspects of a system 600B for using power envelope tracking to control the power supplied to an RFFE power amplifier, in accordance with aspects described herein. In FIG. 6B, the envelope tracking power supply elements are illustrated as disposed within a power management integrated circuit (PMIC) 601. The PMIC includes connections to the transceiver 608, the modem 621, and an RFFE that contains the illustrated transmit PA 450. In FIG. 6B, rather than having machine learning circuitry in the PMIC 601, the machine learning engine 496 is part of the modem 621. Similar feedback and tracking data to the data generated in system 600A of FIG. 6A can be provided from the transceiver 608, the PMIC 601 (e.g., using the replica PA 462 and the monitoring circuitry 495), and the RFFE (e.g., from the transmit PA 450 via the coupler 630). Such feedback and tracking data can be provided directly to the machine learning engine 496 in the modem from the different elements of the system 600B, or can be sent to the feedback circuitry 610 of the transceiver 608, and then provided to the machine learning engine 496 in the modem 621 by the feedback circuitry 610. Similarly, control signals generate by the machine learning engine 496 can be sent directly to the envelope amplification circuitry 524 and/or the switcher circuitry 540, or can be sent via the feedback circuitry 610. In some implementations, space, cost, power, or other design considerations for a PMIC can result in ML engine 496 being more efficiently integrated with the modem 621, with the modem communicating to baseband circuitry, the RFFE module, the PMIC, and other such elements through an interface. The control signals output from the machine learning engine 496 can include signals to adjust amplifier settings of the amplifier circuitry or switching regulator settings for the switcher circuitry, or both the amplifier settings and the switching regulator. The machine learning engine 496 can be configured to identify operational settings for a transmit signal path associated with efficient battery usage and the dynamically clustered data, and to output such control signals to manage operational settings in order to reduce power usage during transmission of portions of the wireless communication signal used to generate the dynamically clustered data. In some implementations, the machine learning engine 496 can send such control signals from the modem 621 to the DAC 510 of the transceiver 608, then to the input interface circuit 522 to control the operational settings of the amplifiers of the envelope amplification circuitry 524. In other implementations, other such interface communications can be used.

Figure 7:
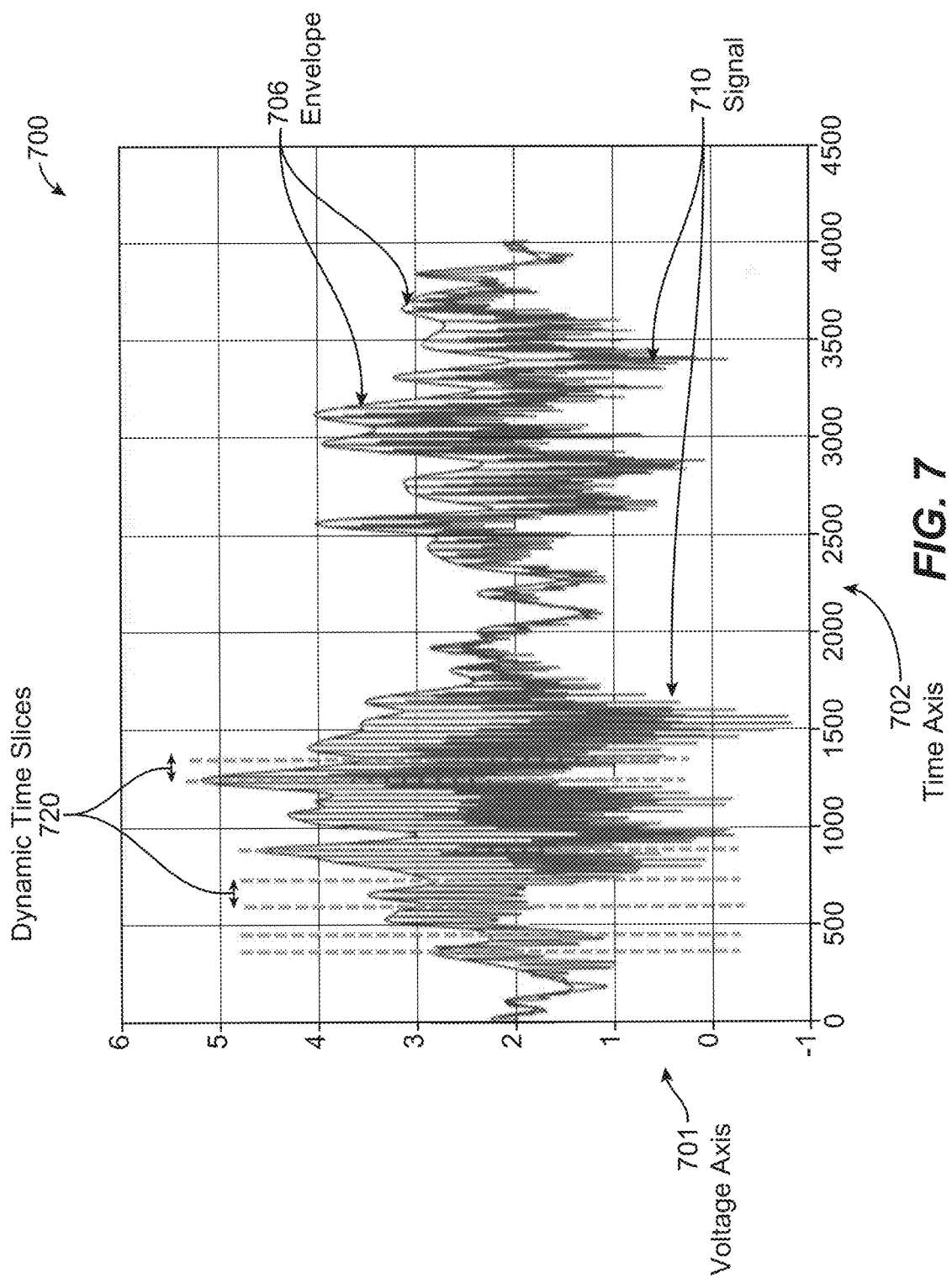
FIG. 7 is a chart illustrating aspects of envelope tracking data for analysis with machine learning in accordance with aspects of the present disclosure.

FIG. 7 is a chart 700 illustrating aspects of envelope tracking data for analysis with machine learning in accordance with aspects of the present disclosure. The chart 700 is similar to the chart 300 of FIG. 3A, with a voltage axis 701, and a time axis 702. The wireless communication signal 710 is a signal that can be amplified by a power amplifier such as the power amplifier 450 for transmission via an antenna. The envelope 706 represents power needed by an amplifier such as the amplifier 450 to output the signal 710 without clipping and signal errors due to an inadequate power supply voltage.

The chart 700 additional illustrates dynamic time slices that can represent characteristics of different conditions for both the envelope 706 and the signal 710. Data such as the envelope 706 and the signal 710 can be gathered by monitoring circuitry both in calibration modes and during real-time operation, and design of monitoring circuitry and machine learning circuitry can be configured for certain dynamic time slices 720 (e.g., where state tracking data for a given time slice is provided as an input to machine learning circuitry) to generate control outputs for a given time slice. For example, certain time slices 720 can have a voltage, other slices can have a low voltage, and other slices can have a large change in voltage. Such differing operating conditions can have different associated control inputs that produce improved operation. Both initial calibration using machine learning circuitry, as well as real-time analysis using machine learning circuitry, can identify differences in control settings for different operating conditions to create selected performance outputs (e.g., reduced power usage, reduced error rates, etc.). In some implementations, time slicing can be a characteristic of a machine learning system, such that machine learning circuitry dynamically selects data from a time slice based on current bandwidth and operating mode states. Similarly, in some implementations, machine learning circuitry can cluster high voltage peak, high voltage slope, and high power events as part of device operation. Such dynamic time slicing can be used in predicting configurations with expected efficiency improvements associated with tracking and machine learning management of controls for different segments or loads (e.g., amplifier and switcher settings for different signal 710 and/or envelope 706 shapes). In various implementations, machine learning circuitry to implement such dynamic controls can be based on neural network circuitry structures, Viterbi decoding circuitry structures, or other such models for dynamic load switching and control of an envelope tracking power supply. The machine learning model can then accept state tracking data in real-time for a given time slice, and generate output control signals to select controls such as amplifier and switcher settings for use during the time slice. The real-time signal data (e.g., coming from a modem generating signals to be transmitted) can include both time slice data and details on transitions between time slices to manage control changes as control settings change.

Some aspects described herein use data from a replica signal path for machine learning circuitry. In other aspects, data from the main path can be used by machine learning circuitry, particularly for aspects without a replica signal path. In still further aspects, data from both the main signal path and the replica signal path can be used by machine learning circuitry.

In some implementations, a feedback receiver can be used to analyze the alignment of the envelope 706 and the signal 710. Such a feedback receiver can, for example, track distortion or noise in the signal 710 or a misalignment between the envelope 706 and the signal 710 (e.g., identifying time misalignments between the envelope 706 and the signal 710). Such issues can be identified to avoid training or operating machine learning systems operating during misalignments which can disrupt learning networks.

Figure 8A:
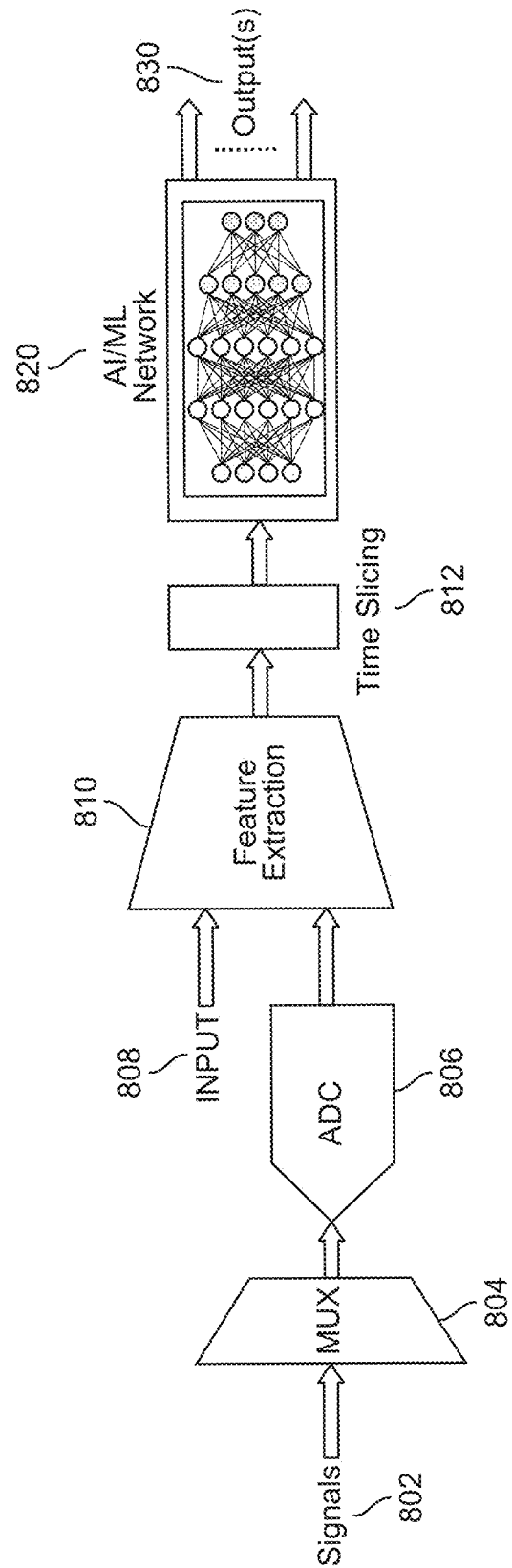
FIG. 8A is a diagram illustrating aspects of machine learning circuitry for use in accordance with aspects described herein.

FIG. 8A illustrates aspects of machine learning circuitry for use in accordance with aspects described herein. As illustrated, the machine learning circuitry of FIG. 8A includes a multiplexer 804 with an input for receiving signals 802. The signals 802 can be real-time analog signals received during operation of a device, or signals received from monitoring circuitry. The analog to digital converter circuitry 806 provides a digital signal to feature extraction circuitry 810 along with any other inputs 808. Time slicing circuitry 812 divides the information from signals 802 and input 808 into dynamic time slices, and uses that information to create discrete inputs to a machine learning network 820, which provides output(s) 830.

Signal 802 and the ADC circuitry 806 can be used to manage data bandwidths to align incoming data with an operating rate for the network 820. The feature extraction circuitry 810 can then accept state tracking data which is matched using time slicing circuitry 812 to the operating rate of the network 820. The paced state tracking data is then provided to the network 820 for a machine learning analysis of and control selection for a given time slice operation of an envelope tracking power supply and transmit power amplifier as described herein. The network 820 can be trained or calibrated using data targeted to generate control signals at the output 830 to track expected waveforms in terms of peaks, slopes, or other signal characteristics. Control signals generated by the outputs 830 can be targeted to limit power dissipation while avoiding errors for each given time slice. In addition to waveform and communication data inputs, device temperature, battery state (e.g., capacity), or other such system operating conditions that can impact waveform tracking can be provided to the network 820 as state tracking data.

Figure 8B:
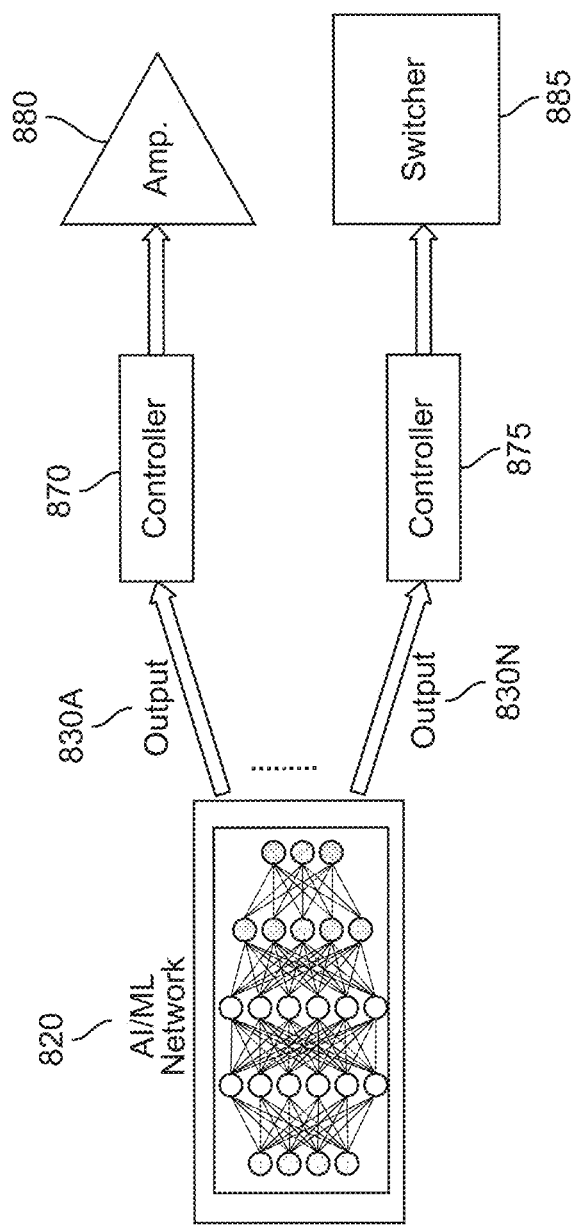
FIG. 8B is a diagram illustrating aspects of machine learning circuitry for use in accordance with aspects described herein.

FIG. 8B is a diagram illustrating aspects of machine learning circuitry for use in accordance with aspects described herein. FIG. 8B includes the network 820 as part of the illustrated machine learning circuitry, with particular outputs provided to control inputs of an envelope tracking power supply. As described above, state tracking data for a given time slice of operation is input to the network 820, which generates outputs 830. The illustrated outputs include two outputs, but in different configurations, can include any number of outputs 830A through 830N. In the example of FIG. 8B, one output is coupled to an amplifier 880 via a controller 870, and another output is coupled to a switcher 885 via a controller 875. The controllers 870, 875 can translate the output signals at the outputs 830A, 830N to a signal format usable by the controllable elements (e.g., the amplifier 880 and the switcher 885). In other implementations, shared controllers can be used for some controllable elements. Additional controllable elements can be, for example, linear amplifier and peaking amplifiers with separate control inputs in some multi-amplifier envelope tracking power supply configurations. Additionally, some system details such as temperature or battery use can have an associated control output. For example, in some implementations, temperature can be an element of state tracking data, and the network 820 can identify operating conditions where and envelope tracking power supply and an associated transmit power amplifier can contribute to thermal runaway conditions. When a thermal runaway condition or excess temperature condition is identified by the network 820, a control output can be coupled to shut down or signal error control circuitry. Similar controls can, for example, be associated with excess battery usage, target thermal conditions, maximum power exposure criteria, or power usage above a threshold under certain battery conditions. In other aspects, other such criteria or thresholds can be used by control circuitry to improve device operations.

FIG. 9 is a flow diagram describing an example of the operation of a method 900 for operation of a device including an envelope tracking power supply as described herein. The blocks in the method 900 can be performed in or out of the order shown, and in some embodiments, can be performed at least in part in parallel.

At block 902 of method 900, the device (or a component thereof) may receive an envelope tracking signal at an envelope signal input port of the envelope tracking power supply.

At block 904 of method 900, the device (or a component thereof) may operate a linear amplifier using the envelope tracking signal with control settings to generate a high frequency component of an envelope tracking supply voltage;

At block 906 of method 900, the device (or a component thereof) may operate switcher circuitry using the control settings and an output of the linear amplifier to generate a low frequency component of the envelope tracking supply voltage;

At block 908 of method 900, the device (or a component thereof) may track performance of a power amplifier operating using the envelope tracking supply voltage to generate state tracking data.

At block 910 of method 900, the device (or a component thereof) may update, using machine learning circuitry with the state tracking data, control settings for the envelope tracking power supply.

Figure 10:
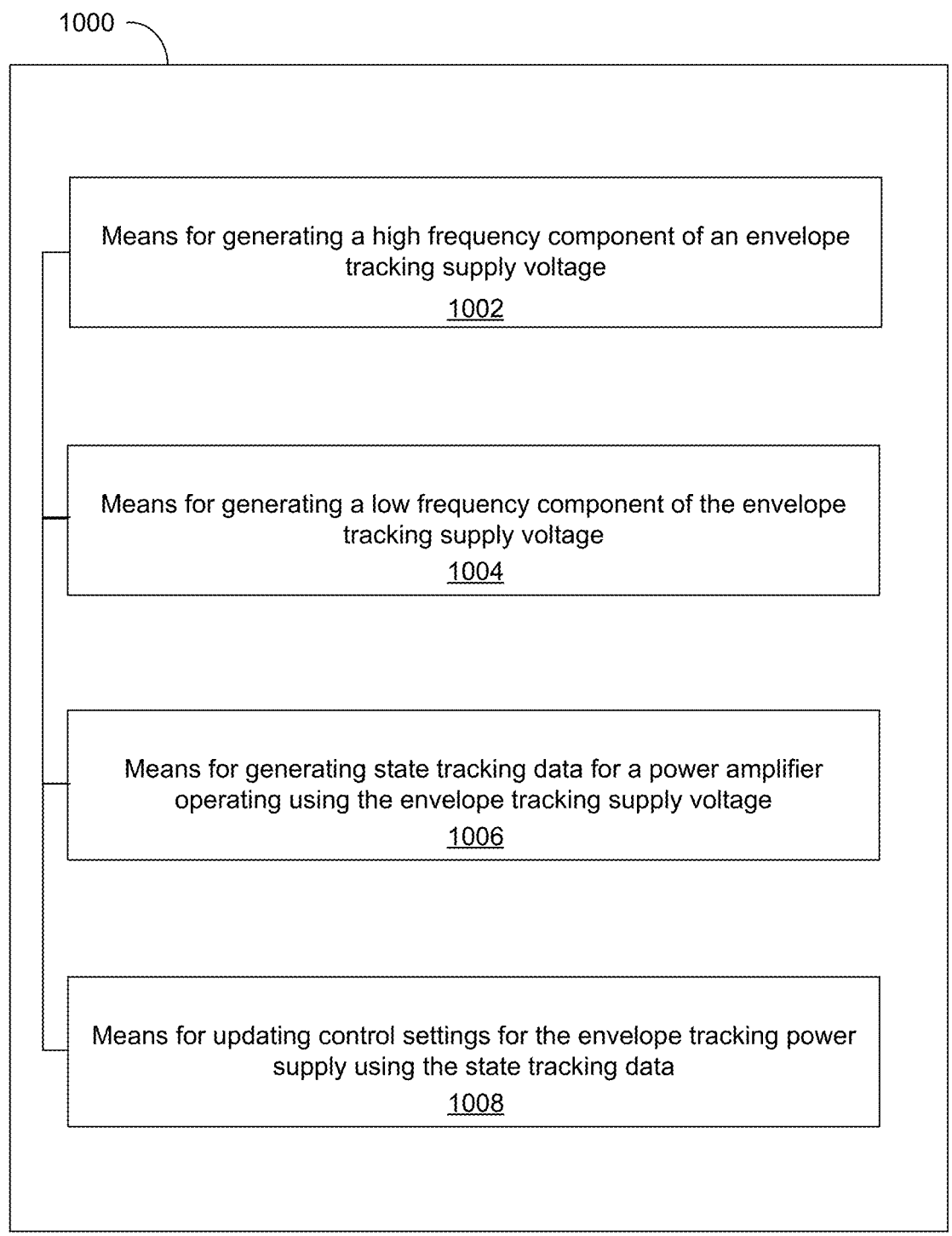
FIG. 10 is a functional block diagram of an apparatus including power envelope tracking to control the power supplied to an RFFE power amplifier in accordance with some aspects of the present disclosure.

FIG. 10 is a functional block diagram of an apparatus 1000 including an architecture for an envelope tracking voltage supply as described herein. The apparatus 1000 comprises means 1002 for generating a high frequency component of an envelope tracking supply voltage. In some aspects, the means 1002 can be the PA 450, of FIGS. 4A-7, along with any elements in the TX path that provides an input signal to the PA 450, or any other such TX path including a power amplifier as described herein. The apparatus 1000 comprises means 1004 for generating a low frequency component of the envelope tracking power supply. In some aspects, the means 1004 can be the switcher 540, along with any other element in the low signal (e.g., DC) selection path, such as the element 546, or elements of the sensing and conditioning circuitry 534 and sensing elements such as sensing elements 530 and 532. The apparatus 1000 comprises means 1006 for generating state tracking data for a power amplifier operating using the envelope tracking supply voltage. In some aspects, the means 1006 includes monitoring circuitry for a main signal path, such as the coupler 630 and the feedback circuitry 610. In some aspects, the means 1006 can include a replica power amplifier and monitoring circuitry such as the monitoring circuitry 495 that gathers data from the replica power amplifier 475. In other aspects, elements for monitoring both the main signal and the replica signal can be part of an individual implementation of the means 1006. Additionally, any implementation of the means 1006 can include memory for storing the state tracking data. The apparatus 1000 comprises means 1008 for updating control settings for the envelope tracking power supply using the state tracking data. The means 1008 can include machine learning or neural network circuitry as described herein, such as the ML engine 496, AI/ML network 820, or any aspect of the feedback circuitry and control circuitry of FIGS. 8A and 8B. In other aspects, any such control and feedback circuitry described herein can be part of the means 1008.

Figure 11:
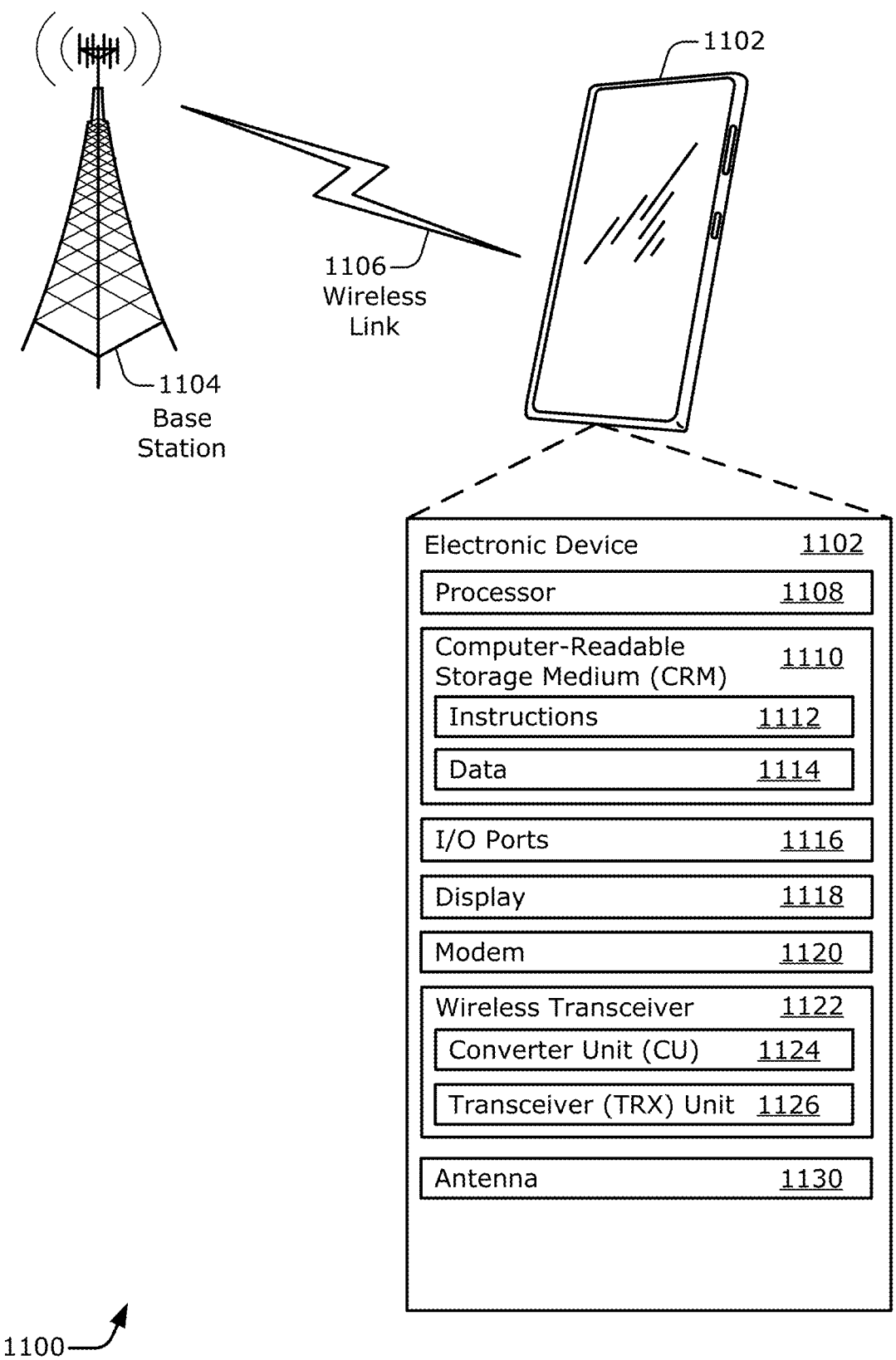
FIG. 11 is a diagram illustrating an environment that includes an electronic device and a base station that can be used with aspects of the present disclosure.

FIG. 11 is a diagram illustrating an exemplary environment 1100 that includes an electronic device 1102 and a base station 1104, each comprising a transceiver (e.g., wireless transceiver 1122 of the electronic device 1102) having a voltage supply for a power amplifier with envelope tracking, in accordance with examples described herein. In the environment 1100, the electronic device 1102 communicates with a base station 1104 through a wireless communication link 1106 (wireless link 1106). In such an example, the electronic device 1102 is depicted as a smart phone. However, the electronic device 1102 may be implemented as any suitable computing or other electronic device, such as a cellular base station, broadband router, access point, cellular or mobile phone, gaming device, navigation device, media device, laptop computer, desktop computer, tablet computer, server, network-attached storage (NAS) device, smart appliance, vehicle-based communication system, Internet-of-Things (IoT) device, and so forth.

The base station 1104 communicates with the electronic device 1102 via the wireless link 1106, which may be implemented as any suitable type of wireless link. Although depicted as a base station tower of a cellular radio network, the base station 1104 may represent or be implemented as another device, such as a satellite, cable television head-end, terrestrial television broadcast tower, access point, peer-to-peer device, mesh network node, router, fiber optic line, another electronic device generally, and so forth. Hence, the electronic device 1102 may communicate with the base station 1104 or another device via a wired connection, a wireless connection, or a combination thereof.

The wireless link 1106 can include a downlink of data or control information communicated from the base station 1104 to the electronic device 1102 and an uplink of other data or control information communicated from the electronic device 1102 to the base station 1104. The wireless link 1106 may be implemented using any suitable communication protocol or standard, such as 3rd Generation Partnership Project Long-Term Evolution (3GPP LTE), 5G New Radio (3GPP 5GNR), IEEE 802.11, IEEE 802.16, Bluetooth™, and so forth.

The electronic device 1102 includes a processor 1108 and a computer-readable storage medium 1110 (CRM 1110). The processor 1108 may include any type of processor, such as an application processor or a multi-core processor, that is configured to execute processor-executable instructions (e.g., code) stored by the CRM 1110. The CRM 1110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 1110 is implemented to store instructions 1112, data 1114, and other information of the electronic device 1102, and thus does not include transitory propagating signals or carrier waves.

The electronic device 1102 may also include input/output ports 1116 (I/O ports 1116) or a display 1118. The I/O ports 1116 enable data exchanges or interaction with other devices, networks, or users. The I/O ports 1116 may include serial ports (e.g., universal serial bus (USB) ports), parallel ports, audio ports, infrared (IR) ports, and so forth. The display 1118 can be realized as a screen or projection that presents graphics, e.g.—one or more graphical images, of the electronic device 1102, such as for a user interface associated with an operating system, program, or application. Alternatively, or additionally, the display 1118 may be implemented as a display port or virtual interface through which graphical content of the electronic device 1102 is communicated or presented.

For communication purposes, the electronic device 1102 also includes a modem 1120, a wireless transceiver 1122, and at least one an antenna 1130. The wireless transceiver 1122 includes a converter unit (CU) 1124 and a transceiver (TRX) unit 1126. The wireless transceiver 1122 provides connectivity to respective networks and other electronic devices connected therewith using RF wireless signals. Additionally, or alternatively, the electronic device 1102 may include a wired transceiver, such as an Ethernet or fiber optic interface for communicating over a personal or local network, an intranet, or the Internet. The wireless transceiver 1122 may facilitate communication over any suitable type of wireless network, such as a wireless local area network (LAN) (WLAN) such as Wi-Fi or Bluetooth, a peer-to-peer (P2P) network, a mesh network, a cellular network (e.g., 3GPP2, 4G LTE, 5G NR, or other cellular network), a wireless wide-area-network (WWAN) (e.g., based on 3GPP2, 4G LTE, 5G NR, etc.), a navigational network (e.g., the Global Positioning System (GPS) of North America or another Satellite Positioning System (SPS)), and/or a wireless personal-area-network (WPAN). In the context of the example environment 1100, the wireless transceiver 1122 enables the electronic device 1102 to communicate with the base station 1104 and networks connected therewith. Other figures referenced herein may pertain to other wireless networks.

The modem 1120, such as a baseband modem, may be implemented as a system on-chip (SoC) that provides a digital communication interface for data, voice, messaging, and other applications of the electronic device 1102. The modem 1120 may also include baseband circuitry to perform high-rate sampling processes that can include analog-to-digital conversion (ADC), digital-to-analog conversion (DAC), gain correction, skew correction, frequency translation, and so forth. The modem 1120 may also include logic to perform in-phase/quadrature (I/Q) operations, such as synthesis, encoding, modulation, demodulation, and decoding. More generally, the modem 1120 may be realized as a digital signal processor (DSP) or a processor that is configured to perform signal processing to support communications via one or more networks. Alternatively, ADC or DAC operations may be performed by a separate component or another illustrated component, such as the wireless transceiver 1122.

The wireless transceiver 1122 can include circuitry, logic, and other hardware for transmitting or receiving a wireless signal for at least one communication frequency band. In operation, the wireless transceiver 1122 can implement at least one radio-frequency transceiver unit to process data and/or signals associated with communicating data of the electronic device 1102 via the antenna 1130. Generally, the wireless transceiver 1122 can include filters, switches, amplifiers, and so forth for routing and processing signals that are transmitted or received via the antenna 1130. Generally, the wireless transceiver 1122 includes multiple transceiver units (e.g., for different wireless protocols such as WLAN versus WWAN or for supporting different frequency bands or frequency band combinations).

The filters, switches, amplifiers, mixers, and so forth of wireless transceiver 1122 can include, in one example, at least one single-ended amplifier, switch circuitry, at least one transformer, at least one differential amplifier, and at least one mixer. In some implementations, the single-ended amplifier, which amplifies a strength of a signal, is coupled to the antenna 1130. Thus, the single-ended amplifier can couple a wireless signal to or from the antenna 1130 in addition to increasing a strength of the signal. In some implementations, the switch circuitry can switchably couple individual transformers a set of transformers to the single-ended amplifier. The set of transformers provides a physical or electrical separation between the single-ended amplifier and other circuitry of the wireless transceiver 1122. The set of transformers also conditions a signal propagating through the set of transformers. Outputs of a transformer can be coupled to one or more mixers.

Some examples can use a differential amplifier at the output of the transformer before the signal is input to a mixer. In such examples, the differential amplifier, like the single-ended amplifier, reinforces a strength of a propagating signal. The wireless transceiver can further perform frequency conversion using a synthesized signal and the mixer. The mixer may include an upconverter and/or a downconverter that performs frequency conversion in a single conversion step, or through multiple conversion steps. The wireless transceiver 1122 may also include logic (not shown) to perform in-phase/quadrature (I/Q) operations, such as synthesis, encoding, modulation, demodulation, and decoding using a synthesized signal.

In some cases, components of the wireless transceiver 1122, or a transceiver unit 1126 thereof, are implemented as separate receiver and transmitter entities. Additionally, or alternatively, the wireless transceiver 1122 can be realized using multiple or different sections to implement respective receiving and transmitting operations (e.g., using separate transmit and receive chains). Example implementations of a transceiver unit 1126 are described above. In addition, different wireless protocols such as WWAN and WLAN may be implemented on separate chips or as separate System-on-a-Chips (SoCs). As such, the blocks such as the modem 1120 and transceiver 1122 may represent more than one modem 1120 or transceiver implemented either together on separate chips or separate SoCs.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR) or corresponding mmW elements, (iv) an ASIC such as a mobile station modem (MSM), (v) a module that may be embedded within other devices, (vi) a receiver, cellular phone, wireless device, handset, or mobile unit, (vii) etc.

Figure 12:
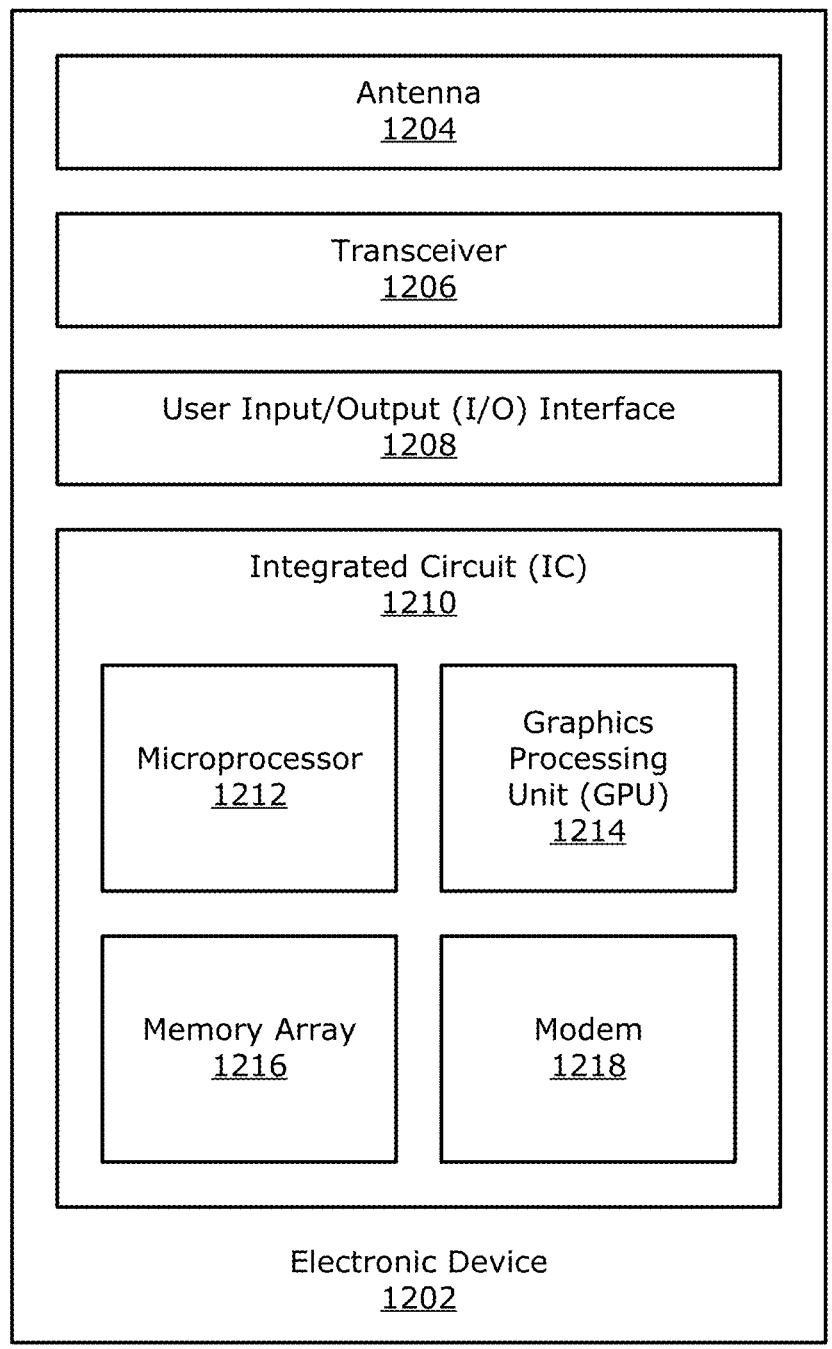
FIG. 12 is a diagram of an electronic device that can be used with aspects of the present disclosure.

FIG. 12 is a diagram illustrating an exemplary electronic device 1202, which includes a transceiver 1206 that can include and/or implement a voltage supply for a power amplifier with envelope tracking as described herein. As shown, the electronic device 1202 includes an antenna 1204, a transceiver 1206, and a user input/output (I/O) interface 1208, in addition to the integrated circuit 1210. Illustrated examples of the integrated circuit 1210, or cores thereof, include a microprocessor 1212, a graphics processing unit (GPU) 1214, a memory array 1216, and a modem 1218. Each component can be operably coupled to another component, such as the GPU 1214 being operably coupled to the user I/O interface 1208.

The electronic device 1202 can be a mobile or battery-powered device or a fixed device that is designed to be powered by an electrical grid. Examples of the electronic device 1202 include a server computer, a network switch or router, a blade of a data center, a personal computer, a desktop computer, a notebook or laptop computer, a tablet computer, a smart phone, an entertainment appliance, or a wearable electronic device such as a smartwatch, intelligent glasses, or an article of clothing. An electronic device 1202 can also be a device, or a portion thereof, having embedded electronics. Examples of the electronic device 1202 with embedded electronics include a passenger vehicle, industrial equipment, a refrigerator or other home appliance, a drone or other unmanned aerial vehicle (UAV), or a power tool.

For an electronic device with a wireless capability, the electronic device 1202 includes an antenna 1204 that is coupled to a transceiver 1206 to enable reception or transmission of one or more wireless signals. The integrated circuit 1210 may be coupled to the transceiver 1206 to enable the integrated circuit 1210 to have access to received wireless signals or to provide wireless signals for transmission via the antenna 1204. The electronic device 1202 as shown also includes at least one user I/O interface 1208. Examples of the user I/O interface 1208 include a keyboard, a mouse, a microphone, a touch-sensitive screen, a camera, an accelerometer, a haptic mechanism, a speaker, a display screen, or a projector.

The integrated circuit 1210 may comprise, for example, one or more instances of a microprocessor 1212, a GPU 1214, a memory array 1216, a modem 1218, and so forth. The microprocessor 1212 may function as a central processing unit (CPU) or other general-purpose processor. Some microprocessors include different parts, such as multiple processing cores, that may be individually powered on or off. The GPU 1214 may be especially adapted to process visual related data for display, such as video data images. If visual-related data is not being rendered or otherwise processed, the GPU 1214 may be fully or partially powered down. The memory array 1216 stores data for the microprocessor 1212 or the GPU 1214. Example types of memory for the memory array 1216 include random access memory (RAM), such as dynamic RAM (DRAM) or static RAM (SRAM); flash memory; and so forth. If programs are not accessing data stored in memory, the memory array 1216 may be powered down overall or block-by-block. The modem 1218 demodulates a signal to extract encoded information or modulates a signal to encode information into the signal. If there is no information to decode from an inbound communication or to encode for an outbound communication, the modem 1218 may be idled to reduce power consumption. The integrated circuit 1210 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1210 may also comprise a system on chip (SoC). An SoC may integrate a sufficient number of different types of components to enable the SoC to provide computational functionality as a notebook computer, a mobile phone, or another electronic apparatus using one chip, at least primarily. Components of an SoC, or an integrated circuit 1210 generally, may be termed cores or circuit blocks. Examples of cores or circuit blocks include, in addition to those that are illustrated in FIG. 12, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a central processing unit or a multimedia processor, may further include multiple internal cores or circuit blocks.

Although selected aspects have been illustrated and described in detail, it will be understood that various substitutions and alterations may be made therein without departing from the spirit and scope of the present invention, as defined by the following claims.

Illustrative aspects of the present disclosure include, but are not limited to:

Aspect 1. An envelope tracking power supply, the envelope tracking power supply comprising: an envelope signal input port; an output power port; an input interface circuit having an output and an input coupled to the envelope signal input port; sensing and conditioning circuitry having an output and an input; amplifier circuitry coupled between the output of the input interface circuit and the input of the sensing and conditioning circuitry, the amplifier circuitry having one or more control inputs; switcher circuitry having an input and an output, wherein the input is coupled to the output of the sensing and conditioning circuitry, and wherein the output is coupled to the output power port; output filter circuitry, wherein the output filter circuitry is coupled to the output power port via the output filter circuitry; and machine learning circuitry having an output coupled to the one or more control inputs, and one or more inputs configured to receive state tracking data for performance of a transmit power amplifier (PA) that receives power via the output power port.

Aspect 2. The envelope tracking power supply of Aspect 1, wherein the envelope tracking power supply further comprises a replica power amplifier having a signal input, a supply input coupled to the output power port, and a signal output, wherein the signal output is coupled to the machine learning circuitry to provide a radio frequency signal as part of the state tracking data, wherein the signal input is configured to receive a wireless communication signal, and wherein the envelope signal input port is configured to receive an envelope tracking signal generated from the wireless communication signal.

Aspect 3. The envelope tracking power supply of any of Aspects 1 to 2, wherein the state tracking data further comprises a high frequency voltage value output from the amplifier circuitry, a low frequency voltage value output from the switcher circuitry, and a sensing value input to the sensing and conditioning circuitry from the amplifier circuitry.

Aspect 4. The envelope tracking power supply of any of Aspects 1 to 3, further comprising: digital to analog converter (DAC) circuitry coupled to the input interface circuit and the replica power amplifier, wherein the DAC circuitry is configured to provide a test signal to the replica power amplifier to generate the state tracking data as calibration data during a calibration mode used with the replica power amplifier enabled and the radio frequency front end (RFFE) unit that includes the transmit power amplifier disabled to create initial control settings for operation of the transmit power amplifier.

Aspect 5. The envelope tracking power supply of Aspect 4, wherein the DAC circuitry comprises a transmit DAC and an envelope tracking DAC.

Aspect 6. The envelope tracking power supply of any of Aspects 1 to 5, wherein the sensing value is generated by a sensing element coupled between the output of the amplifier circuitry and the input of the sensing and conditioning circuitry.

Aspect 7. The envelope tracking power supply of any of Aspects 1 to 6, wherein the output power port is coupled to a voltage supply of a transmission power amplifier, and wherein the transmission power amplifier is configured to amplify a wireless communication signal.

Aspect 8. The envelope tracking power supply of any of Aspects 1 to 7, an envelope tracking signal input to the envelope signal input port is received from modem circuitry used to generate a tracking voltage at the output power port.

Aspect 9. The envelope tracking power supply of any of Aspects 1 to 8, wherein coupler circuitry is coupled to an output of the transmission power amplifier to provide feedback as part of the state tracking data.

Aspect 10. The envelope tracking power supply of any of Aspects 1 to 9, wherein the amplifier circuitry comprises a linear amplifier configured to provide a first portion of a high frequency component of a tracking voltage; and wherein the amplifier circuitry further comprises a switching amplifier configured to operate in a saturation mode and provide a second portion of the high frequency component of the tracking voltage when the tracking voltage is above a threshold value.

Aspect 11. The envelope tracking power supply of Aspect 10, wherein the threshold value is based on a peak-to-average power ratio (PAPR) of a wireless communication signal, a traffic value associated with the wireless communication signal, a bandwidth associated with the wireless communication signal, or an operating mode.

Aspect 12. The envelope tracking power supply of any of Aspects 1 to 11, wherein the one or more control inputs comprise a control input to select between an on state and an off state for the switching amplifier.

Aspect 13. The envelope tracking power supply of any of Aspects 1 to 12, wherein the one or more control inputs further comprises: a first tracking value generated by a first sensing element coupled between an output of the linear amplifier and the input of the sensing and conditioning circuitry; and a second tracking value generated by a second sensing element coupled between an output of the switching amplifier and the input of the sensing and conditioning circuitry.

Aspect 14. The envelope tracking power supply of any of Aspects 1 to 13, wherein the one or more control inputs comprise an envelope tracking signal input to the envelope signal input port.

Aspect 15. The envelope tracking power supply of any of Aspects 1 to 14, wherein the one or more control inputs comprises a synchronization signal matching an envelope tracking signal input to the envelope signal input port to a wireless transmission signal generated using a power amplifier having a voltage input coupled to the output power port.

Aspect 16. The envelope tracking power supply of any of Aspects 1 to 15, wherein the envelope tracking signal and the wireless transmission signal are both generated by modem circuitry using a same set of communication data.

Aspect 17. The envelope tracking power supply of any of Aspects 1 to 16, wherein the state tracking data comprises dynamic time slice data of for a wireless communication signal.

Aspect 18. The envelope tracking power supply of Aspect 17, wherein the dynamic time slice data comprises dynamically clustered data based on one or more of a bandwidth for the wireless communication signal, a device operating mode, high peak signal events, high slope signal events, high power events.

Aspect 19. The envelope tracking power supply of any of Aspects 1 to 18, wherein the machine learning circuitry is configured to condition circuitry in a transmit signal path using prediction outputs generated from the dynamically clustered data.

Aspect 20. The envelope tracking power supply of any of Aspects 1 to 19, wherein the machine learning circuitry is configured to identify operational settings for a transmit signal path associated with efficient battery usage and the dynamically clustered data, and to output control signals to adjust amplifier settings to reduce power usage during transmission of portions of the wireless communication signal used to generate the dynamically clustered data.

Aspect 21. A method of operating an envelope tracking power supply, the method comprising: receiving an envelope tracking signal at an envelope signal input port of the envelope tracking power supply; operating a linear amplifier using the envelope tracking signal with control settings to generate a high frequency component of an envelope tracking supply voltage; operating switcher circuitry using the control settings and an output of the linear amplifier to generate a low frequency component of the envelope tracking supply voltage; tracking performance of a power amplifier operating using the envelope tracking supply voltage to generate state tracking data; using a machine learning circuitry with the state tracking data to update control settings for the envelope tracking power supply.

Aspect 22. The method of Aspect 21, wherein the power amplifier comprises a replica power amplifier used in a feedback system of the envelope tracking power supply, wherein the envelope tracking signal is generated from a wireless communication signal, and wherein the control settings are further used to control a transmit power amplifier used to transmit the wireless communication signal via an antenna of a wireless communication apparatus.

Aspect 23. The method of any of Aspects 21 to 22, wherein envelope tracking power supply further comprises digital to analog converter (DAC) circuitry coupled to an input interface circuit and the replica power amplifier.

Aspect 24. The method of any of Aspects 21 to 23, further comprising: calibrating initial control settings for operation of the power amplifier by generating, using the DAC circuitry, a test signal to the replica power amplifier to generate the state tracking data as calibration data during a calibration mode used with the replica power amplifier enabled and the power amplifier disabled.

Aspect 25. A method of operating an envelope tracking power supply comprising: performing a first power consumption measurement in an envelope tracking power supply at a first performance setting with a linear amplifier disabled and a switcher circuit enabled, wherein the envelope tracking power supply comprises the linear amplifier configured to provide a high frequency component of an envelope tracking supply voltage, and wherein the envelope tracking power supply further comprises the switcher circuit configured to provide a low frequency component of the envelope tracking supply voltage; performing a second power consumption measurement at the first performance setting with the linear amplifier enabled and the switcher circuit disabled; performing a third power consumption measurement at the first performance setting with the linear amplifier enabled and the switcher circuit enabled; and performing an operating analysis using the first power consumption measurement, the second power consumption measurement, and the third power consumption measurement; and updating control settings based on the operating analysis.

Aspect 26. The method of Aspect 25, wherein the first performance setting includes the envelope tracking supply voltage configured with a 100 megahertz frequency component.

Aspect 27. The method of any of Aspects 25 to 26, wherein the first power consumption measurement includes an error rate measurement associated with envelope tracking performance at the first performance setting.

Aspect 28. An apparatus comprising: a power management integrated circuit comprising: an envelope signal input port; an output power port; an input interface circuit having an output and an input coupled to the envelope signal input port; sensing and conditioning circuitry having an output and an input; amplifier circuitry coupled between the output of the input interface circuit and the input of the sensing and conditioning circuitry, the amplifier circuitry having one or more control inputs; switcher circuitry having an input and an output, wherein the input is coupled to the output of the sensing and conditioning circuitry, and wherein the output is coupled to the output power port; and output filter circuitry, wherein the output filter circuitry is coupled to the output power port via the output filter circuitry; a transmit power amplifier (PA) that receives power via the output power port; and machine learning circuitry having an output coupled to the one or more control inputs, and one or more inputs configured to receive state tracking data for performance of the transmit PA (e.g., of a radio frequency front end (RFFE) unit).

Aspect 29: apparatus of Aspect 28, further comprising a modem, wherein the modem comprises the machine learning circuitry; and wherein the machine learning circuitry is configured to output control signals to reduce power usage by adjusting amplifier settings of the amplifier circuitry or switching regulator settings for the switcher circuitry.

Aspect 30: An apparatus comprising means for performing operations according to any of aspects 1 through 29 above.

Aspect 31: A non-transitory computer-readable storage medium comprising instructions stored thereon which, when executed by one or more processors, cause the one or more processors to implement operations according to any of aspects 1 through 29 above.

What is claimed is:

1. An envelope tracking power supply, the envelope tracking power supply comprising:
an envelope signal input port;
an output power port;
an input interface circuit having an input coupled to the envelope signal input port and an output;
sensing and conditioning circuitry having an output and an input;
amplifier circuitry coupled between the output of the input interface circuit and the input of the sensing and conditioning circuitry, the amplifier circuitry having one or more control inputs;
switcher circuitry having an input and an output, wherein the input is coupled to the output of the sensing and conditioning circuitry, and wherein the output is coupled to the output power port;
output filter circuitry, wherein the amplifier circuitry is coupled to the output power port via the output filter circuitry; and
machine learning circuitry having an output coupled to the one or more control inputs, and one or more inputs configured to receive state tracking data for performance of transmit power amplifier (PA) that receives power via the output power port.

2. The envelope tracking power supply of claim 1, wherein the envelope tracking power supply further comprises a replica power amplifier having a signal input, a supply input coupled to the output power port, and a signal output, wherein the signal output is coupled to the machine learning circuitry to provide a radio frequency signal as part of the state tracking data, wherein the signal input is configured to receive a wireless communication signal, and wherein the envelope signal input port is configured to receive an envelope tracking signal generated from the wireless communication signal.

3. The envelope tracking power supply of claim 2, wherein the state tracking data further comprises a high frequency voltage value output from the amplifier circuitry, a low frequency voltage value output from the switcher circuitry, and a sensing value input to the sensing and conditioning circuitry from the amplifier circuitry.

4. The envelope tracking power supply of claim 3, further comprising:
digital to analog converter (DAC) circuitry coupled to the input interface circuit and the replica power amplifier, wherein the DAC circuitry is configured to provide a test signal to the replica power amplifier to generate the state tracking data as calibration data during a calibration mode used with the replica power amplifier enabled and a radio frequency front end (RFFE) module that includes the transmit power amplifier such that the RFFE module and the transmit power amplifier are disabled to create initial control settings for operation of the RFFE transmit power amplifier.

5. The envelope tracking power supply of claim 3, wherein the sensing value is generated by a sensing element coupled between the output of the amplifier circuitry and the input of the sensing and conditioning circuitry.

6. The envelope tracking power supply of claim 4, wherein the DAC circuitry comprises a transmit DAC and an envelope tracking DAC.

7. The envelope tracking power supply of claim 1, wherein the output power port is coupled to a voltage supply of a transmission power amplifier, and wherein the transmission power amplifier is configured to amplify a wireless communication signal.

8. The envelope tracking power supply of claim 7, an envelope tracking signal input to the envelope signal input port is received from modem circuitry used to generate a tracking voltage at the output power port.

9. The envelope tracking power supply of claim 7, wherein coupler circuitry is coupled to an output of the transmission power amplifier to provide feedback as part of the state tracking data.

10. The envelope tracking power supply of claim 1, wherein the amplifier circuitry comprises a linear amplifier configured to provide a first portion of a high frequency component of a tracking voltage; and
wherein the amplifier circuitry further comprises a switching amplifier configured to operate in a saturation mode and provide a second portion of the high frequency component of the tracking voltage when the tracking voltage is above a threshold value.

11. The envelope tracking power supply of claim 10, wherein the threshold value is based on a peak-to-average power ratio (PAPR) of a wireless communication signal, a traffic value associated with the wireless communication signal, a bandwidth associated with the wireless communication signal, or an operating mode.

12. The envelope tracking power supply of claim 10, wherein the one or more control inputs comprise a control input to select between an on state and an off state for the switching amplifier.

13. The envelope tracking power supply of claim 12, wherein the one or more control inputs further comprises:
a first tracking value generated by a first sensing element coupled between an output of the linear amplifier and the input of the sensing and conditioning circuitry; and
a second tracking value generated by a second sensing element coupled between an output of the switching amplifier and the input of the sensing and conditioning circuitry.

14. The envelope tracking power supply of claim 1, wherein the one or more control inputs comprise an envelope tracking signal input to the envelope signal input port.

15. The envelope tracking power supply of claim 1, wherein the one or more control inputs comprises a synchronization signal matching an envelope tracking signal input to the envelope signal input port to a wireless transmission signal generated using a power amplifier having a voltage input coupled to the output power port.

16. The envelope tracking power supply of claim 15, wherein the envelope tracking signal and the wireless transmission signal are both generated by modem circuitry using a same set of communication data.

17. The envelope tracking power supply of claim 1, wherein the state tracking data comprises dynamic time slice data of for a wireless communication signal.

18. The envelope tracking power supply of claim 17, wherein the dynamic time slice data comprises dynamically clustered data based on one or more of a bandwidth for the wireless communication signal, a device operating mode, high peak signal events, high slope signal events, high power events.

19. The envelope tracking power supply of claim 18, wherein the machine learning circuitry is configured to condition circuitry in a transmit signal path using prediction outputs generated from the dynamically clustered data.

20. The envelope tracking power supply of claim 18, wherein the machine learning circuitry is configured to identify operational settings for a transmit signal path associated with efficient battery usage and the dynamically clustered data, and to output control signals to reduce power usage during transmission of portions of the wireless communication signal used to generate the dynamically clustered data.

21. The envelope tracking power supply of claim 20, wherein the control signals adjust amplifier settings of the amplifier circuitry or switching regulator settings for the switcher circuitry, or both the amplifier settings and the switching regulator settings.

22. A method of operating an envelope tracking power supply, the method comprising:
receiving an envelope tracking signal at an envelope signal input port of the envelope tracking power supply;
operating a linear amplifier using the envelope tracking signal with control settings to generate a first portion of a high frequency component of an envelope tracking supply voltage;
operating a switching amplifier using the envelope tracking signal with the control settings to generate a second portion of the high frequency component of the envelope tracking supply voltage when the envelope tracking supply voltage is above a threshold value, wherein the control settings are used to select between an on state and an off state for the switching amplifier;
operating switcher circuitry using the control settings and an output of the linear amplifier to generate a low frequency component of the envelope tracking supply voltage;
tracking performance of a power amplifier operating using the envelope tracking supply voltage to generate state tracking data; and
updating, using a machine learning circuitry with the state tracking data, control settings for the envelope tracking power supply.

23. The method of claim 22, wherein the power amplifier comprises a replica power amplifier used in a feedback system of the envelope tracking power supply, wherein the envelope tracking signal is generated from a wireless communication signal, and wherein the control settings are further used to control the power amplifier, wherein the power amplifier is used to transmit the wireless communication signal via an antenna of a wireless communication apparatus.

24. The method of claim 23, wherein envelope tracking power supply further comprises digital to analog converter (DAC) circuitry coupled to an input interface circuit and the replica power amplifier.

25. The method of claim 24, further comprising:
calibrating initial control settings for operation of the power amplifier by generating, using the DAC circuitry, a test signal to the replica power amplifier to generate the state tracking data as calibration data during a calibration mode used with the replica power amplifier enabled and the power amplifier disabled.

26. A method of operating an envelope tracking power supply comprising:
performing a first power consumption measurement in an envelope tracking power supply at a first performance setting with a linear amplifier disabled and a switcher circuit enabled, wherein the envelope tracking power supply comprises the linear amplifier configured to provide a high frequency component of an envelope tracking supply voltage, and wherein the envelope tracking power supply further comprises the switcher circuit configured to provide a low frequency component of the envelope tracking supply voltage;
performing a second power consumption measurement at the first performance setting with the linear amplifier enabled and the switcher circuit disabled;

performing a third power consumption measurement at the first performance setting with the linear amplifier enabled and the switcher circuit enabled; and performing an operating analysis using the first power consumption measurement, the second power consumption measurement, and the third power consumption measurement; and updating control settings based on the operating analysis.

27. The method of claim 26, wherein the first performance setting includes the envelope tracking supply voltage configured with a 100 megahertz frequency component.

28. The method of claim 26, wherein the first power consumption measurement includes an error rate measurement associated with envelope tracking performance at the first performance setting.

29. An apparatus comprising:
a power management integrated circuit (PMIC) comprising:
   an envelope signal input port;
   an output power port;
   an input interface circuit having an input coupled to the envelope signal input port and an output;
   sensing and conditioning circuitry having an output and an input;
   amplifier circuitry coupled between the output of the input interface circuit and the input of the sensing and conditioning circuitry, the amplifier circuitry having one or more control inputs;
   switcher circuitry having an input and an output, wherein the input is coupled to the output of the sensing and conditioning circuitry, and wherein the output is coupled to the output power port; and
   output filter circuitry, wherein the amplifier circuitry is coupled to the output power port via the output filter circuitry;
a transmit power amplifier (PA) that receives power via the output power port; and
machine learning circuitry having an output coupled to the one or more control inputs, and one or more inputs configured to receive state tracking data for performance of the transmit PA.

30. The apparatus of claim 29, further comprising a modem, wherein the modem comprises the machine learning circuitry; and
wherein the machine learning circuitry is configured to output control signals to reduce power usage by adjusting amplifier settings of the amplifier circuitry or switching regulator settings for the switcher circuitry.

* * * * *